United States Patent
Sachs et al.

(10) Patent No.: US 10,724,965 B2
(45) Date of Patent: Jul. 28, 2020

(54) SYSTEMS AND METHODS FOR CRACK DETECTION

(71) Applicant: Massachusetts Institute of Technology, Cambridge, MA (US)

(72) Inventors: Emanuel M. Sachs, Newton, MA (US); Tonio Buonassisi, Cambridge, MA (US); Sarah Wieghold, Somerville, MA (US); Zhe Liu, Xi'an (CN)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/271,049

(22) Filed: Feb. 8, 2019

(65) Prior Publication Data
US 2019/0250108 A1     Aug. 15, 2019

Related U.S. Application Data

(60) Provisional application No. 62/628,896, filed on Feb. 9, 2018.

(51) Int. Cl.
*G01N 21/95* (2006.01)
*G01N 21/88* (2006.01)
*H01L 21/67* (2006.01)

(52) U.S. Cl.
CPC ..... *G01N 21/9505* (2013.01); *G01N 21/8806* (2013.01); *H01L 21/67288* (2013.01); *G01N 2201/06113* (2013.01)

(58) Field of Classification Search
CPC ............. G01N 21/896; G01N 21/8806; G01N 21/9505; G01N 2201/06113; G01N 21/67288
See application file for complete search history.

(56) References Cited

U.S. PATENT DOCUMENTS 5,790,247 A * 8/1998 Henley ................ G01N 21/958
356/237.1
6,108,077 A * 8/2000 Heaton ............... G01N 21/9501
356/213

(Continued)

FOREIGN PATENT DOCUMENTS

EP     1801569 A2     6/2007
EP     2781912 A1     9/2014

(Continued)

OTHER PUBLICATIONS

International Search Report and Written Opinion dated Apr. 23, 2019 for Application No. PCT/US19/17199.

(Continued)

*Primary Examiner* — Steven Whitesell Gordon
(74) *Attorney, Agent, or Firm* — Wolf, Greenfield & Sacks, P.C.

(57) ABSTRACT

Embodiments related to systems and methods of crack detection in wafers (e.g., silicon wafers for photovoltaics, photovoltaic devices including silicon wafers) are disclosed. In some embodiments, an apparatus may include a light source configured to illuminate a side of a wafer and a camera directed towards a first face of the wafer. In some embodiments, a long axis of a field of view of the camera may be angled relative to a propagation direction of the light source. In some embodiments, at least a portion of the field of view of the camera is offset from the path of propagation of light emitted from the light source through the wafer. In some embodiments, at least a portion of a light beam may be oriented at a positive non-zero angle relative to the first face of the wafer, and a dimension of the light beam normal to the first face of the wafer may be larger than a thickness of the wafer.

31 Claims, 30 Drawing Sheets

(56) References Cited

U.S. PATENT DOCUMENTS

| | | |
|---|---|---|
| 7,650,028 B1 | 1/2010 | Burns et al. |
| 8,400,630 B2 | 3/2013 | Hemsendorf et al. |
| 8,428,337 B2 | 4/2013 | Chan |
| 9,157,869 B2 | 10/2015 | Ortner et al. |
| 2009/0220864 A1* | 9/2009 | Tanabe ................. G01N 21/958 430/5 |
| 2010/0014083 A1 | 1/2010 | Ueno et al. |
| 2011/0058161 A1* | 3/2011 | Hemsendorf .......... H01R 39/32 356/239.1 |
| 2011/0268344 A1 | 11/2011 | Chan |
| 2012/0044346 A1* | 2/2012 | Chou ................. G01N 21/9505 348/131 |
| 2012/0307236 A1* | 12/2012 | Ortner ................ G01N 21/9505 356/239.3 |
| 2014/0152976 A1* | 6/2014 | VanHoomissen ............................ G01N 21/9505 356/51 |
| 2016/0313257 A1 | 10/2016 | Marivoet et al. |

FOREIGN PATENT DOCUMENTS

| | | | |
|---|---|---|---|
| JP | 5559163 B2 | 7/2014 | |
| WO | WO-2010121753 A1 * | 10/2010 | ......... G01N 21/9505 |
| WO | WO 2010/137431 A2 | 12/2010 | |
| WO | WO 2011/017772 A1 | 2/2011 | |

OTHER PUBLICATIONS

Hull, Detection of cracks in ceramics used in electronic devices using light scattering. Nondestructive Characterization of Materials VI. Springer. 1994. p. 469-470. Retrieved online at https://link.springer.com/chapter/10.1007/978-1-4615-2574-5_59 [Last accessed Apr. 4, 2019].

* cited by examiner 10-pixel linescan profile

Differentiation & peak detection

SYSTEMS AND METHODS FOR CRACK DETECTION

RELATED APPLICATIONS

This application claims the benefit under 35 U.S.C. § 119(e) to U.S. Provisional Application Ser. No. 62/628,896, entitled "SYSTEMS AND METHODS FOR CRACK DETECTION" filed Feb. 9, 2018, which is herein incorporated by reference in its entirety.

GOVERNMENT SUPPORT

This invention was made with Government support under Grant No. DE-EE0007535 awarded by the Department of Energy (DOE). The Government has certain rights in the invention.

FIELD

Embodiments related to systems and methods of crack detection in wafers (e.g., silicon wafers for photovoltaics, photovoltaic devices including silicon wafers) are disclosed.

BACKGROUND

Micro-crack detection is important in manufacturing of silicon (Si) wafer solar cells and modules, because micro-cracks may reduce the mechanical strength of Si wafers and lead to wafer breakage in the production line. Not only does the breakage reduce the manufacturing yield, thereby increasing the production cost per solar cell, but also cleaning wafer fragments can be very costly if a cell breaks at a critical step (e.g. etching bath, plasma-enhanced chemical vapor deposition (PECVD) chamber, etc.). Micro-cracks in the wafers could also develop into a shunt and reduce the solar cell efficiency, even if those wafers did not break in the manufacturing process. In addition, if solar cells with micro-cracks are encapsulated into a module, these micro-cracks could grow larger during module operation in the field, causing problems in the long-term reliability of a photovoltaic module.

The impact of smaller micro-cracks becomes more pronounced when Si wafers become thinner than the current standard thickness of 180 microns. Utilizing thinner wafers has significant cost benefits. Wafer thickness reduction is an effective way to achieve dollar-per-watt variable cost reduction, and it is also one of the highest-impact single factors to reduce capital expenditure (capex) for photovoltaic (PV) module factories. However, high breakage rates of thinner wafers in the production line, as well as relatively low polycrystalline silicon (poly-Si) price, discourage thickness reduction in today's PV industry. The impact of micro-cracks is especially significant when they intersect a side of the wafer because such cracks are particularly likely to propagate when stress is applied to the wafer or when the wafer is subject to strain.

Two exemplary methods of crack detection that have been used in silicon wafer production are: luminescence imaging, and optical imaging using near-infrared (NIR) or electromagnetic radiation (also herein referred to as light) of other wavelengths. Luminescence imaging, including photoluminescence and electroluminescence, relies on the physical principle that increased non-radiative recombination at the crack interface results in a dark feature the luminescence image. This technique may work well for monocrystalline silicon (mono-Si) wafers, but not for multicrystalline silicon (multi-Si) wafers due to severe interference by recombination-active features (e.g., grain boundary, dislocation, metal contact region, etc.). Optical imaging, using NIR or light of other wavelengths, is better suited for crack detection in multi-Si wafers. A common technique of optical imaging (e.g., optical NIR imaging) is rear-illuminated transmission imaging. A main concern for rear-illuminated transmission imaging is that the technique cannot be applied for finished solar cells with full area rear contacts. A second problem for rear-illuminated transmission imaging is that the sensitivity for small micro-cracks is reduced as the crack width becomes smaller than the pixel size. For example, an apparatus that uses a side-coupled NIR laser illumination, and scans the wafer with a linescan camera synchronized and collinear with the light beam, may fail to detect cracks that are aligned with the light beam. Other techniques that have been used for crack detection, such as scanning acoustic microscopy and ultrasonic thermography, have low throughput in detecting micro-cracks.

SUMMARY

In some embodiments, an apparatus for crack detection includes a light source constructed and arranged to illuminate a side of a wafer when the wafer is positioned in the apparatus and a camera directed towards a first face of the wafer when the wafer is positioned in the apparatus. A long axis of a field of view of the camera is angled relative to a propagation direction of the light source.

In some embodiments, An apparatus for crack detection includes a camera directed towards a first face of a wafer when the wafer is positioned in the apparatus and a light source configured to emit a light beam towards a side of the wafer when the wafer is positioned in the apparatus. At least one portion of the light beam is oriented at a positive non-zero angle relative to the first face of the wafer when the wafer is positioned in the apparatus, and a dimension of the light beam that is normal to the first face of the wafer is larger than a thickness of the wafer.

In some embodiments, an apparatus for crack detection includes a light source constructed and arranged to illuminate a side of a wafer when the wafer is positioned in the apparatus and a camera directed towards a first face of the wafer when the wafer is positioned in the apparatus. At least one portion of a field of view of the camera is offset from a path of propagation of light emitted from the light source.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF THE DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings.

DETAILED DESCRIPTION

Figure 1A:
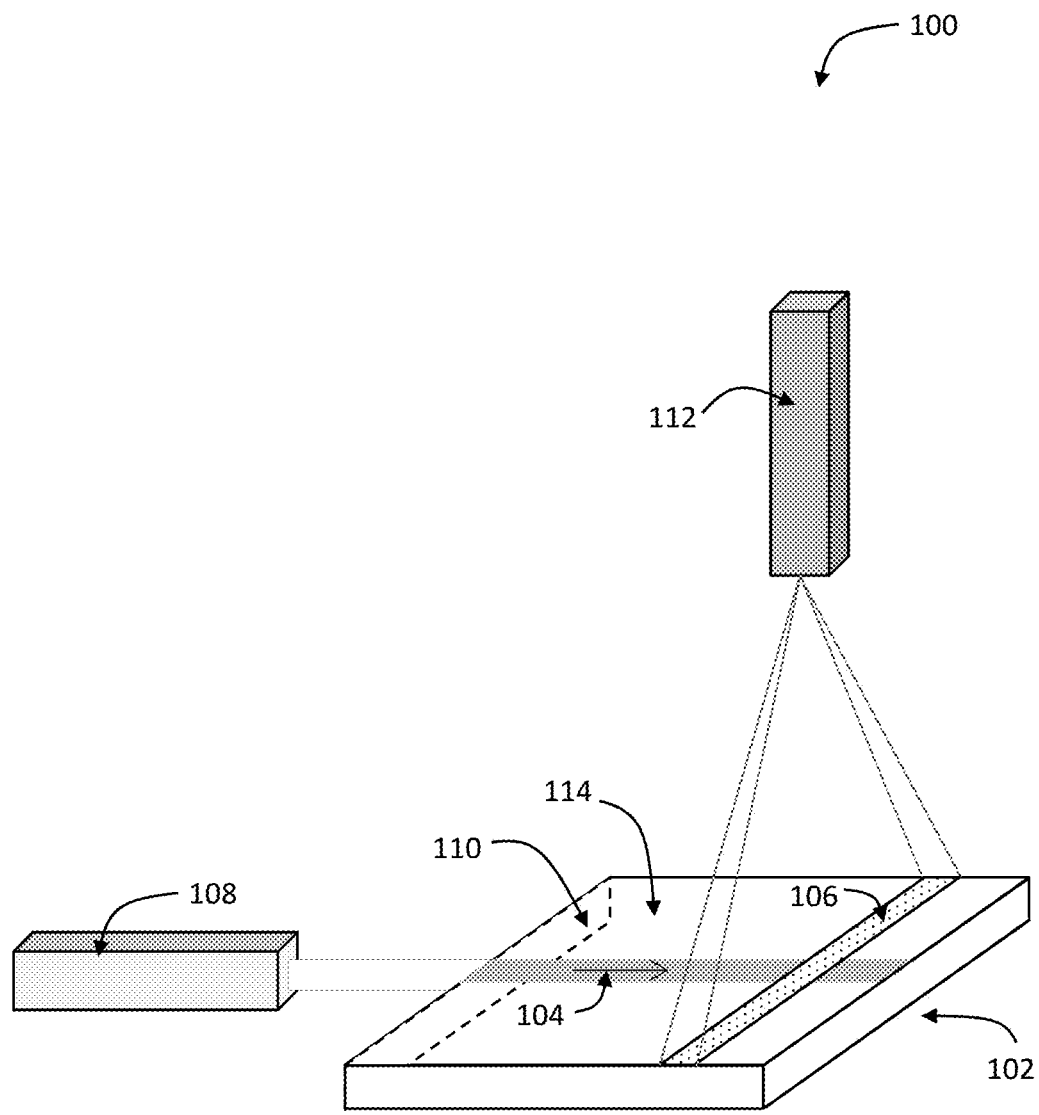
FIG. 1A is a perspective schematic view of an apparatus for crack detection, according to some illustrative embodiments.

In some embodiments of this disclosure, systems and methods for detecting cracks (e.g., micro-cracks), which in some embodiment may be near a side of a wafer, are disclosed. Specifically, the Inventors have determined that cracks (e.g., micro-cracks) located at the side of a silicon wafer may be more important for wafer breakage than cracks (e.g., micro-cracks) located at the interior of the wafer. For example, it was found that a side crack with a small length almost always resulted in fracture in a mechanical twist test, but an interior crack with the same length could pass the test. However, typically applied techniques do not detect micro-cracks particularly well. For example, some crack detection systems may include a light source constructed and arranged to illuminate a side of a wafer (i.e., a surface of the wafer having a principal direction that is a thickness of the wafer), and a camera directed towards a face of the wafer (i.e., a largest planar surface of the wafer such as an upper and/or opposing bottom surface of a wafer that are located in planes that may be substantially parallel to the side of the wafer). In these systems, a long axis of a field of view of the camera may be parallel to (e.g., co-linear with) a propagation direction of the light source. Specifically, the Inventors recognized a problem that when a light beam enters the side of a wafer that has rough faces (e.g. opposing top and bottom surfaces), scattering of the light occurs because the faces of the wafer are rough. Therefore, a significant amount of light from the light beam is scattered outward which results in a bright field image where it is difficult to detect the presence of cracks corresponding to higher intensity brightness areas within the overall bright field image. Therefore, the Inventors have recognized that it may be desirable to image cracks within a wafer being imaged with increased contrast to improve the ease and accuracy of crack detection.

The Inventors have also determined that in some systems where the long axis of the field of view of a linescan camera is oriented in a direction parallel to and aligned with (i.e. may be co-linear with) a propagation direction of the light beam, crack detection may become even more difficult due to the crack being directly illuminated by the light source. Further, in some instances, the line scan camera's field of view may also be co-linear with the propagation direction of the light beam. Therefore, in some instances, this may result in no detectable contrast being observed for a crack due to the scattered light either saturating the camera and/or the crack filling the field of view of the linescan camera. This again may make crack detection using a system where a camera is aligned with the propagation of a light beam through a corresponding wafer more difficult.

In view of the above, the Inventors have determined that cracks (e.g., micro-cracks) can be more readily detected when a long axis of the field of view of a camera is oriented at an angle to a propagation direction of light from the light source through an associated wafer. In some embodiments, the camera may have a field of view with a long axis that is oriented at an approximately perpendicular angle (i.e. 90 degrees) relative to a propagation direction of light from the light source.

The Inventors have also recognized an advantage associated with having at least a portion of the field of view of a camera being offset from the path of propagation of light through a wafer and a side of a wafer being imaged. More specifically, one or more portions of a wafer removed from the direct path of light through the wafer may show reduced saturation from scattered light that is detected by the camera. This may result in an image that is closer to a dark field image where the scattered light from a crack is more easily imaged and detected.

In some prior crack detection systems, direct illumination may be used for crack detection in Si wafers (e.g., for photovoltaics) and solar cell manufacturing, where light is directly incident onto the crack (e.g., either through a wafer surface or through a side), and the propagation of the unidirectional light beam is altered by reflection at the crack interface. However, these systems suffer from the deficiencies noted previously. In contrast, the Inventors have recognized the benefits associated with vicinal illumination for crack detection. For example, in some embodiments light is coupled into a wafer within a small area near a crack location, and subsequently the light within the wafer may get scattered by the wafer surfaces. In some embodiments, when scattered light reaches a crack, it will be reflected back at the crack interface. Therefore, in such embodiments, an abrupt contrast of bright and dark regions at each side of the crack may be observed at the crack location. Accordingly, in some embodiments, vicinal illumination may be accomplished by having the location of incidence of the light offset from a field of view of a camera, whether a linescan camera, a full area camera, or other appropriate type of camera. In some embodiments, the location of incidence of the light may be placed within the field of view of the camera, but instances where an image is taken when the light is incident directly on a crack, may be discarded from the analysis, in favor of images where the light is offset from the crack.

Crack detection in a silicon, or other type of, wafer by optical methods generally involves illuminating (e.g., coupling light into) the wafer and detecting any disruption of light propagation (e.g., due to micro-cracks). The term "vicinal illumination" as used herein is related to the concept where the path of propagation of a light beam impinges on the wafer in the vicinity of the crack, but not directly on the crack. Depending on whether light is introduced directly onto or vicinal (i.e. adjacent to the region where the crack is located or in the vicinity of the crack), illumination can be referred to as direct illumination or vicinal illumination, respectively. For example, a light beam emitted by a light source may be incident on a side of a wafer such that a path of propagation of the light through the wafer extends through the field of view of a camera while a portion of the field of view of the camera extends outside the path of propagation of the light. Additionally, embodiments in which the field of view of the camera lies entirely outside of the field of view of the camera are also envisioned. In either case, these embodiments may be viewed as providing vicinal illumination and imaging of the portions of a wafer located outside the path of propagation of the light through the wafer and within the field of view of the camera.

As described herein, a wafer may include a first face (e.g., an upper face) that a camera is oriented towards and images. The wafer may also include an opposing second face (e.g., lower face) located opposite the first face and at least one side disposed and extending between the first and second faces of the wafer. The wafer may also include at least two opposing edges associated with the outer perimeters of the two faces which correspond to the intersections of the at least one side with the first and second faces. Thus, the at least one side and the first and second faces of the wafer may be viewed as intersecting one another at two opposing parallel edges of the wafer. It should be understood that while a particular embodiment may be described using upper and lower faces and a side disposed and extending between these upper and lower faces, these terms are used for illustrative purposes to provide the relative positioning of the various components and are not intended to limit the various embodiments to any particular orientation. For example, the systems disclosed herein may be oriented vertically upwards, vertically downwards, horizontally, and/or any other desirable orientation for a desired crack inspection system as the disclosure is not limited in this fashion.

In the above embodiments, the field of view of a camera may include at least one portion (e.g., some portions) that is located at a distance from a path of propagation of light from the light source through the wafer that is/are between or equal to 0.25 mm and 10 mm, 0.5 mm and 10 mm, 1 mm and 3 mm, 1 mm and 2 mm, and/or any other appropriate distance from the propagation path of the light through the wafer. In some embodiments, a portion of the field of view may be in the path of propagation of the light from the light source while other portions are offset from the path of propagation of the light. According to this embodiment, the other portions may be analyzed to detect cracks and the directly illuminate portion of the field of view may be ignored, discarded, and/or filtered. For example, the camera may account for a known position of the path of the light propagation within a wafer when analyzing images for crack detection. In addition, the Inventors determined that the sensitivity to micro-cracks of an apparatus with these features increased when the examined field of view of the camera was located away from the side of the wafer toward an interior of the wafer. For example, a camera's field of view may be offset from a side of a wafer by a distance that is between or equal to 100 microns and 2 mm, 300 microns and 500 microns, or any other appropriate distance. In such embodiments, the scattering of the light incident upon the side or edges of the wafer may not become part of the image seen by the camera.

As noted above, the field of view of a camera on the wafer may be any suitable length so as to cover a portion of the scattered light range of the light source light in the wafer. For example, in one embodiment, the field of view of a camera may be between or equal to 0.5 mm long and 10 mm long. In such an embodiment, a white-out zone where there is too much scattered light from the incident light beam may extend to about 0.25 mm from the path of the light source through the wafer and there may be almost no scattered light outside of 10 mm. Of course, other specific ranges may be possible depending on the specific materials, light sources, and methods used.

In some instances it may be desirable to reduce the amount of light scattering outward from a face of a wafer being imaged by a camera. For example, if a light were directed onto a face of the wafer being imaged, it may result in light being reflected and/or scattered towards the camera which may make crack detection more difficult. Accordingly, in some embodiments, it may be desirable to avoid a light beam being directed directly onto the face of a wafer that is being imaged by a camera where it may be reflected and/or scattered. In such an embodiment, the light source may be positioned and oriented such that at least a portion, and in some embodiments the entirety, of the emitted light beam may be oriented at a positive non-zero angle relative to a first face (e.g., an upper face) of the wafer being imaged by a camera to avoid the light beam being directly incident upon the first face of the wafer. In other words, a propagation direction of the light emitted by a light source may include a component that is parallel to the face of the wafer being imaged and a component that is perpendicular to the face being imaged and oriented towards the camera such that a non-zero angle is formed between the propagation direction and the face being imaged by the camera. For example, the light source may be positioned below a wafer and oriented at an upwards angle towards the wafer side such that the light source is disposed in a plane that is parallel to the face being imaged and located on a side of the face being imaged that is opposite the camera. Alternatively, the light source may be directed at the side of the wafer at an appropriate angle such that a divergence angle of the light beam results in the portion of the light beam located and directed above the first face of the wafer being imaged being oriented at a positive non-zero angle relative to the first face of the wafer. This may again result in the light beam not being incident directly on the first face of the wafer being imaged by a camera.

In addition to the above, in some embodiments, it may be desirable to avoid transmission of a light beam through a wafer. Therefore, it may be desirable in some instances to limit the angle of a light beam incident upon a side of a wafer to be less than an angle of total internal reflection of the wafer. In the case of a silicon wafer, this positive non-zero angle relative to a surface being imaged may be greater than or equal to 0.1 degrees (e.g., 0.2 degrees) and less than the angle of total internal reflection of silicon which is about 15 degrees. Of course, in other embodiments, the a light beam incident on a side of the wafer may have an angle relative to a face being imaged by a camera that is greater than or equal to the angle of total internal reflection of the wafer, as the present disclosure is not so limited. For example, the direction of propagation of the light beam may have an angle relative to a face being imaged that is between about 0.1 degrees and 89.9 degrees, 0.1 degrees and 45 degrees, and/or any other appropriate angle both greater and less than those noted above depending on the particular embodiment.

The Inventors also recognized the problem of throughput limitations when scanning a light source (e.g., a laser) having a small spot size (e.g., of less than or equal to 100 microns, of between or equal to 20 microns and 50 microns, e.g., of 20 microns) along a side of a thin wafer (e.g., of between or equal to 180 microns and 200 microns, of 200 microns, 180 microns, 100 microns, or 80 microns in thickness) to detect cracks. Specifically, tracking the side of the wafer and adjusting the positioning of a smaller light source to stay within the side of the wafer during real-time scanning is difficult. Accordingly, the Inventors have developed a solution to this problem by configuring the light source to emit a light beam towards a side of the wafer where a dimension of the light beam that is normal to the first face of the wafer (i.e. a thickness of the light beam incident on the wafer side) is larger than a thickness of the wafer measured in the same direction. This dimension advantageously eliminates the need for a complex tracking system on a moving object to maintain the light beam on the wafer side because the light beam is sized such that the side of the wafer is maintained within the light beam as the wafer side is moved relative to the camera and light beam. This dimension can be accomplished, for example, by using anamorphic optics (e.g., using a cylindrical lens, prism, combinations of the forgoing, and/or any other appropriate optical component) to form a divergent beam with a line of light with a desired size and shape rather than a spot of light. In some embodiments, the distance between the light source and the side of a wafer may be approximately equal to the focal length of the optics of the light source. For example, the above noted cylindrical lens may be located approximately at its focal length from the wafer side. Without wishing to be bound by theory, such an arrangement may provide an increased light source intensity within the detection area. However, embodiments in which a light source is located at different distances are also contemplated as the disclosure is not limited to any particular distance of the light source relative to the wafer.

In some embodiments, it may be desirable to prevent light from being incident on a face of a wafer opposite a face of the wafer being imaged by a camera. Again, this may help to avoid the occurrence of scattering and/or reflection which may make crack detection more difficult. For example, a device may include a chuck or carriage on which the wafer is disposed, and an edge of the chuck may extend past an edge and/or side of the wafer so that the bottom surface of the wafer is covered. This may prevent light from entering the bottom surface of the wafer through the chuck, and thereby may prevent scattered light from entering the field of view through the bottom surface of the wafer and confusing an image. Further, in some embodiments, the chuck may also be comprised of, and/or coated with, a material that absorbs light in the wavelength range of the light source. However, embodiments in which a chuck does not extend past an edge and/or side of a wafer are also contemplated. For instance, to reduce reflection from the chuck, in some embodiments, a wafer may be positioned such that a side of the wafer being imaged may overhang, i.e. extend past, a side of the chuck by a predetermined distance (e.g., by between or equal to 0.1 mm and 10 mm, by between or equal to 1 mm and 10 mm). This may help reduce the occurrence of light hitting the chuck and entering the wafer through the bottom surface.

It should be understood that the light sources described herein may correspond to any appropriate light source capable of emitting a beam of light with a desired range of wavelengths of light towards a wafer. In some instances, the beam of light emitted by a light source may be a collimated beam of light. Examples of appropriate light sources may include, but are not limited to: a laser; an incandescent bulb and/or LED combined with lenses and/or slits to form a collimated beam; and/or any other appropriate light source. In some embodiments, the light source may emit light with wavelengths and/or may use appropriate filtering to provide a light beam including light wavelengths in the infrared spectrum as detailed further below. For example, filtering may be used to block visible light, and/or another range of wavelengths, to provide the desired range of wavelengths for imaging and detection purposes. However, instances in which different wavelengths of light are emitted and/or filtered by a light source are also contemplated.

In some embodiments, an apparatus for crack detection is provided. The apparatus may include a light source. In some embodiments, the light source is constructed and arranged to illuminate a side of a wafer when the wafer is positioned in the apparatus. In some embodiments, the light source comprises a collimation lens and a focusing lens. In some embodiments, the light source comprises a spherical or aspherical collimation lens and a cylindrical focusing lens and/or prism. In some embodiments, the light source emits light having a wavelength to which a wafer is at least partially transparent. In some embodiments, the light source emits light having a wavelength greater than the band gap of silicon or another appropriate wafer material. In some embodiments, the light source emits light having a wavelength of greater than 1.1 microns. In some embodiments, the light source emits light having a wavelength of greater than 1.1 microns and at most 12 microns. In some embodiments, the light source emits light having a wavelength of around 1.3 microns or around 10 microns (e.g., for a $CO_2$ laser). In some embodiments, the light source arrangement comprises a near infrared light source. In some embodiments, the near infrared light source emits light having a wavelength of around 1.3 microns. In some embodiments, the light source is a laser diode. The above-noted light wavelength examples are applicable at least for a silicon wafer. However, it should be understood that the current disclosure is not limited to any particular type of light source and/or corresponding detector. Instead, any appropriate light source may be used that is capable of emitting any appropriate wavelength of light that a desired wafer material (e.g., glass, alumina, etc.) is at least partially transparent to. As discussed previously, the light source may be any suitable illumination source which emits an appropriate wavelength of light, including, but not limited to, laser diodes and incandescent bulbs.

In some embodiments, an apparatus may include a light source configured to emit a light beam towards a side of a wafer when the wafer is positioned in the apparatus. In some embodiments, at least a portion, and in some instances an entirety, of the light beam is oriented at a positive non-zero angle relative to a first face of the wafer when the wafer is positioned in the apparatus, such that a component of the direction of propagation of the light is from a lower surface (e.g., second face) toward the upper surface (e.g., first face) of the wafer. Accordingly, the portion of the emitted light beam that is above the first face of the wafer may be oriented at a positive non-zero angle relative to the first face of the wafer which may thus avoid light being directly incident on the first face of the wafer, which may otherwise result in undesired reflected and/or scattered light from the first face. In some embodiments, a dimension of the light beam that is normal to the first face of the wafer is larger than a thickness of the wafer. In some embodiments, the portion of the light beam extending above the first face of the wafer, and in some instances the entire light beam, may be angled relative to the first face of the wafer being imaged at an angle that may be between or equal to 0.1° and 45°, 1° and 2°, 5° and 15° and/or any other appropriate angle such that the light is not directly incident on the upper face of the wafer being imaged, is blocked from being directly incident on the lower face of the wafer opposite the face being imaged, and still impinges on at least some portion of a side of the wafer. In some embodiments, the light source may have a line width of less than or equal to 250 microns (e.g., between or equal to 2 microns and 200 microns, less than or equal to 200 microns, e.g., about 20 microns), or any other appropriate dimension. Though in some embodiments, the laser may be as narrow as possible within practical limits.

In some embodiments, the apparatus comprises a camera. In some embodiments, the apparatus comprises a camera directed towards a first face of a wafer when the wafer is positioned in the apparatus. In some embodiments, the camera is a linescan camera. In some embodiments, the linescan camera is directed towards the first face of the wafer when the wafer is positioned in the apparatus. In some embodiments, a long axis of a field of view of the camera (e.g., linescan camera) is angled relative to a propagation direction of the light source. In some embodiments, the camera (e.g., linescan camera) is oriented at an angle that is between or equal to 45 degrees and 135 degrees relative to, and in some instances may be perpendicular to, the propagation direction of the light source. In some embodiments, at least one portion of a field of view of the camera (e.g., linescan camera) may be offset from the path of propagation of light emitted from the light source. In some embodiments, the apparatus further comprises a controller that analyzes the at least one portion of the field of view offset from the path of propagation of light emitted from the light source to detect the presence or absence of a crack. In some embodiments, the at least one portion of the field of view of the camera (e.g., linescan camera) is offset from the path of propagation of the light emitted from the light source by at least 0.25 mm.

In some embodiments, a camera of a detection apparatus as disclosed herein may be a linescan camera. Additionally, the camera may be an indium gallium arsenide camera (e.g., in embodiments where the light source emits light having a wavelength of 1.3 microns or other appropriate wavelength capable of being imaged by the camera). In some embodiments, the camera (e.g., linescan camera) may have a high framerate between or equal to 20 kHz and 80 kHz. A linescan camera has an advantage of higher framerate capabilities than a comparable area camera which may enable faster scanning rates. In some embodiments, the camera comprises a photodetector including a plurality of pixels. In some embodiments, the camera is a linescan camera comprising a photodetector including a linear (one-dimensional) array of pixels. In such embodiments, a long axis of a linescan camera may be directed in the direction of the linear array of pixels. In some embodiments, the camera is an area camera comprising a photodetector including a two-dimensional array of pixels which may again include a field of view with an axis that is longer than the other dimension of the field of view (i.e. the long axis of the field of view). In some embodiments, the camera (e.g., linescan camera) comprises a photodetector and a microscope lens between the silicon wafer and the photodetector. In some embodiments, the camera captures an image of a first face of the wafer about every 0.5 mm to 5 mm. In some embodiments, there may be one linescan camera per side of a wafer or one per two sides (e.g., 2 or 4 line cameras for a rectangular wafer). In some embodiments, the camera may use anamorphic optics, or a pixel array of the camera may comprise asymmetric pixels. An anamorphic camera (e.g., accomplished by optics or asymmetric pixels) may decrease noise and allow a larger sampling area than would a similar camera with a spherical lens and symmetric pixels.

The above-noted camera types and ranges are applicable at least for a silicon wafer. However, it should be understood that any appropriate type and/or number of cameras may be used to image a desired substrate as the disclosure is not limited to any particular range of properties and/or type of camera.

In some embodiments, an apparatus may include a wafer positioned in the apparatus. In some embodiments, the field of view of the camera (e.g., linescan camera) may be offset from a side of the wafer. In some embodiments, the field of view of the camera (e.g., linescan camera) is offset from the side of the wafer by a distance that is between or equal to 100 microns and 2 mm (e.g., between or equal to 300 microns and 500 microns), though other distances are also contemplated. For example, in some embodiments, the offset between the side of the wafer and the field of view of the camera may be minimized while still avoiding light scattering effects from light incident on one or both edges of the wafer to enable the detection of smaller cracks. Specifically, larger offsets may result in smaller cracks originating at a side of the wafer being missed during detection. Therefore, this offset may be selected to be a small as possible in some embodiments while still providing accurate crack detection, though it should be understood that offsets both smaller and larger than those noted above may be used.

In some embodiments, an apparatus may be configured to move a wafer (e.g., silicon wafer) relative to a camera (e.g., linescan camera) and/or to a light source in at least one dimension. In some embodiments, the apparatus is configured to move the wafer relative to the camera and/or to the light source in at least two dimensions. In some embodiments, the apparatus is configured to move the camera relative to the wafer in at least one dimension. In some embodiments, the apparatus is configured to move the camera relative to the wafer in at least two dimensions. In some embodiments, the apparatus further comprises a mobile component (e.g., conveyor belt, motor, chuck, actuator, etc.) to move the wafer relative to the camera and/or to the light source, or to move the camera relative to the wafer, in at least one dimension (e.g., in at least two dimensions). In some embodiments, the apparatus is configured to move the light source relative to the wafer and/or to the camera. In some embodiments, the movement of the camera or wafer or light source may be continuous.

According to exemplary embodiments of the present disclosure, systems and methods for crack (e.g., microcrack) detection allow for reliable detection of sub-millimeter (sub-mm) side cracks while achieving high throughput for in-line detection tools. Some embodiments of this disclosure show improvements over dark-field imaging techniques (e.g., using NIR) by utilizing side-coupled vicinal illumination, and demonstrate reliable detection of sub-mm micro-cracks in multi-crystalline Si wafers. In addition, when comparing systems and methods disclosed in some embodiments herein with NIR transmission imaging, the systems and methods in some embodiments herein have an advantage of sensitivity, e.g., for detecting several microcracks with different orientations. Furthermore, the systems and methods in some embodiments herein can be combined with a high-throughput in-line metrology tool with a linescan camera, which can achieve high (e.g., 1 sec/wafer) throughput and can be used to inspect various samples comprising silicon wafers at every processing step, from as-cut wafers to finished solar cells (e.g., including laser-cut half cells).

For the sake of clarity, the embodiments described herein are primarily described relative to the detection of cracks within silicon wafers. However, the current disclosure is not limited to uses only in silicon wafers. Instead, the currently disclosed systems and methods may be used with any appropriate type of wafer and/or other appropriately thin component where it is desirable to detect cracks therein and which are sufficiently thin to permit the currently described methods and systems to be implemented. It should be understood that any appropriate light source with any appropriate wavelength of light to which a desired wafer and/or component is at least partially transparent may be used as the disclosure is not limited to any particular range of wavelengths and/or type of light source.

Turning now to the figures, several non-limiting embodiments are described in further detail. However, it should be understood that the current disclosure is not limited to only those specific embodiments described herein. Instead, the various disclosed components, features, and methods may be arranged in any suitable combination as the disclosure is not so limited.

FIG. 1A is a three dimensional schematic of an apparatus 100 for crack detection, according to some illustrative embodiments. The depicted apparatus 100 includes a light source, which in this embodiment is depicted as a laser 108, constructed and arranged to illuminate a side 110 of a wafer 102 when the wafer 102 is positioned in the apparatus 100. The depicted apparatus 100 also includes a linescan camera 112, or other appropriate camera, directed towards a first face (e.g., upper surface) 114 of the wafer 102 when the wafer 102 is positioned in the apparatus 100. A long axis of a field of view 106 of the linescan camera 112 is angled relative to a path of propagation 104, and the corresponding propagation direction, of the laser 108. The linescan camera has a long axis of a field of view 106 that extends outwards from the path of propagation 104 of the laser through the wafer. The first face 114 of the wafer 102 intersects the side 110 of the wafer 102.

Figure 1B:
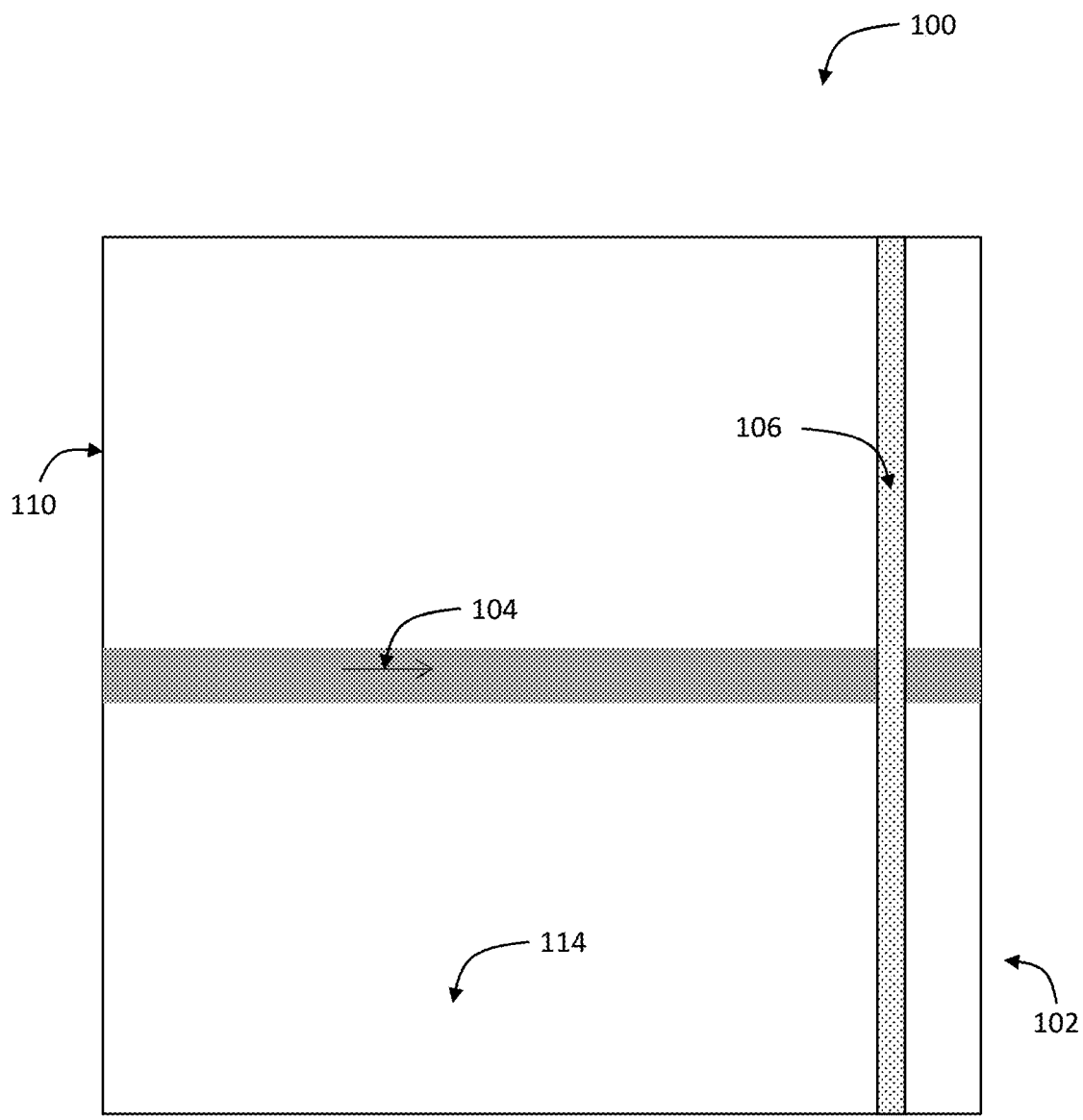
FIG. 1B is a schematic of a top-down view of a first face of a wafer (e.g., silicon wafer) in the apparatus of FIG. 1A for crack detection, according to some illustrative embodiments.

FIG. 1B is a schematic of a top-down view of a first face 114 of a wafer 102 in an apparatus 100 as in FIG. 1A for crack detection, according to some illustrative embodiments.

Figure 2A:
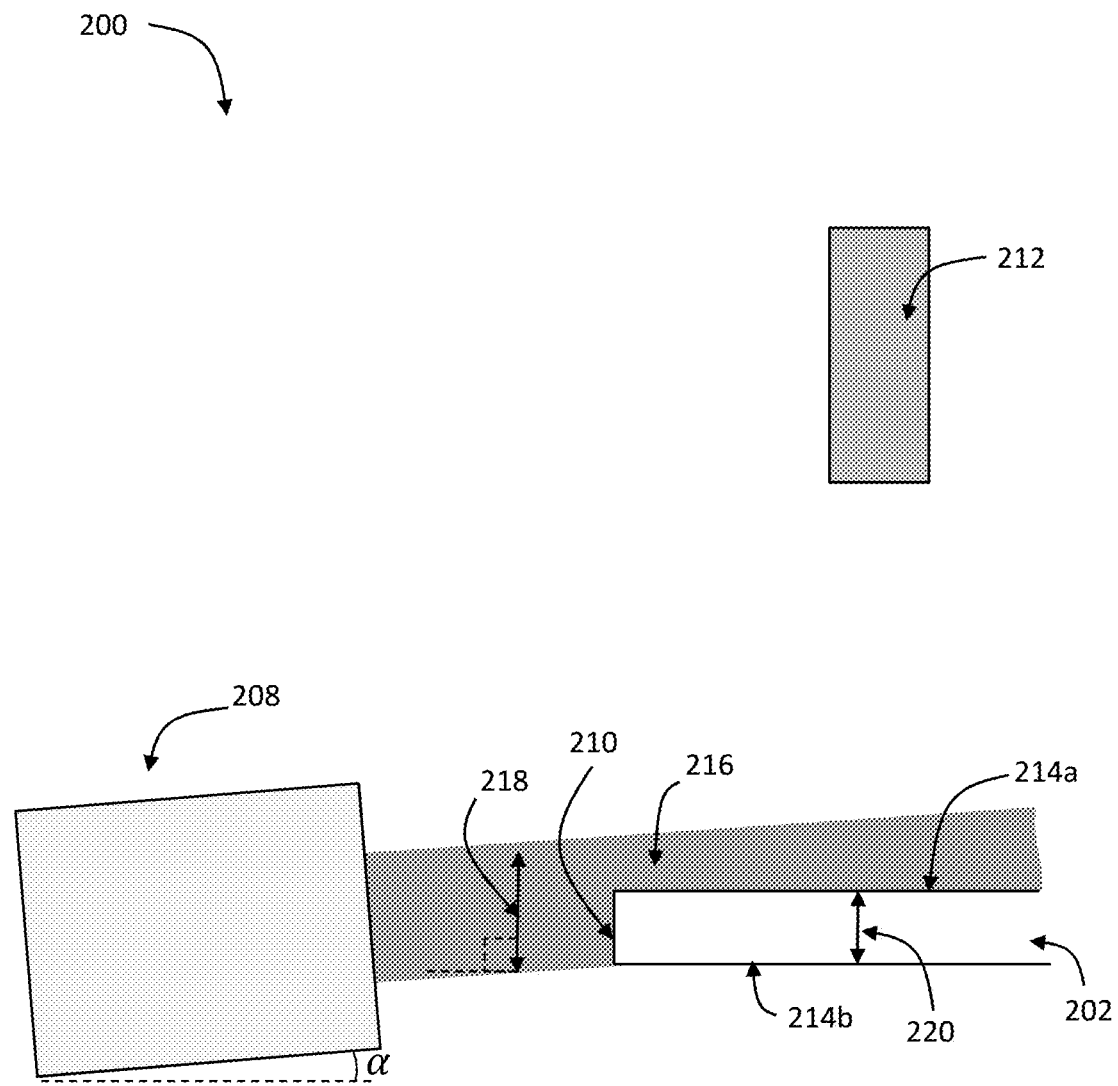
FIG. 2A is a schematic side view of an apparatus for crack detection, according to some illustrative embodiments.

FIG. 2A is a two dimensional schematic of an apparatus 200 for crack detection, according to some illustrative embodiments. The depicted apparatus 200 includes a camera 212 directed towards a first face (e.g., upper surface) 214 of a wafer 202 when the wafer 202 is positioned in the apparatus. The depicted apparatus 200 also includes a light source, such as a laser 208, configured to emit a light beam 216 towards a side 210 of the wafer 202 when the wafer 202 is positioned in the apparatus 200. At least a portion of the light beam 216 is oriented at a positive non-zero angle α (alpha) relative to the first face 214a of the wafer 202 when the wafer 202 is positioned in the apparatus 200. A dimension 218 of the light beam 216 that is normal to the first face 214 of the wafer 202 is larger than a thickness 220 of the wafer 202 in the same direction. In some embodiments, the light beam is emitted from a position that is located in a plane that is parallel to and below the first face of the wafer such that it is oriented upwards at the desired angle towards the wafer side. The wafer and laser are arranged so that the laser light is able to enter at least some portion of the side of the wafer. Further, due to the orientation of the light beam, the light beam may not directly incident upon the first face of the wafer, which as noted previously may reduce the reflection and scattering of light towards the associated camera of the apparatus. In some embodiments, the light source may also be positioned and oriented to avoid incidence on the second opposing face 214b as also shown in the figure. The side of the wafer on which the light is incident may be polished, smooth or rough. While any appropriate angle of incidence may be used, as noted previously, in some embodiments, the angle may be selected such that the light incident on the wafer edge may undergo total internal reflection within the wafer. Of course, the angle may also be selected such that the light incident on the wafer edge exceeds the total internal reflection angle, as the present disclosure is not so limited.

Figure 2B:
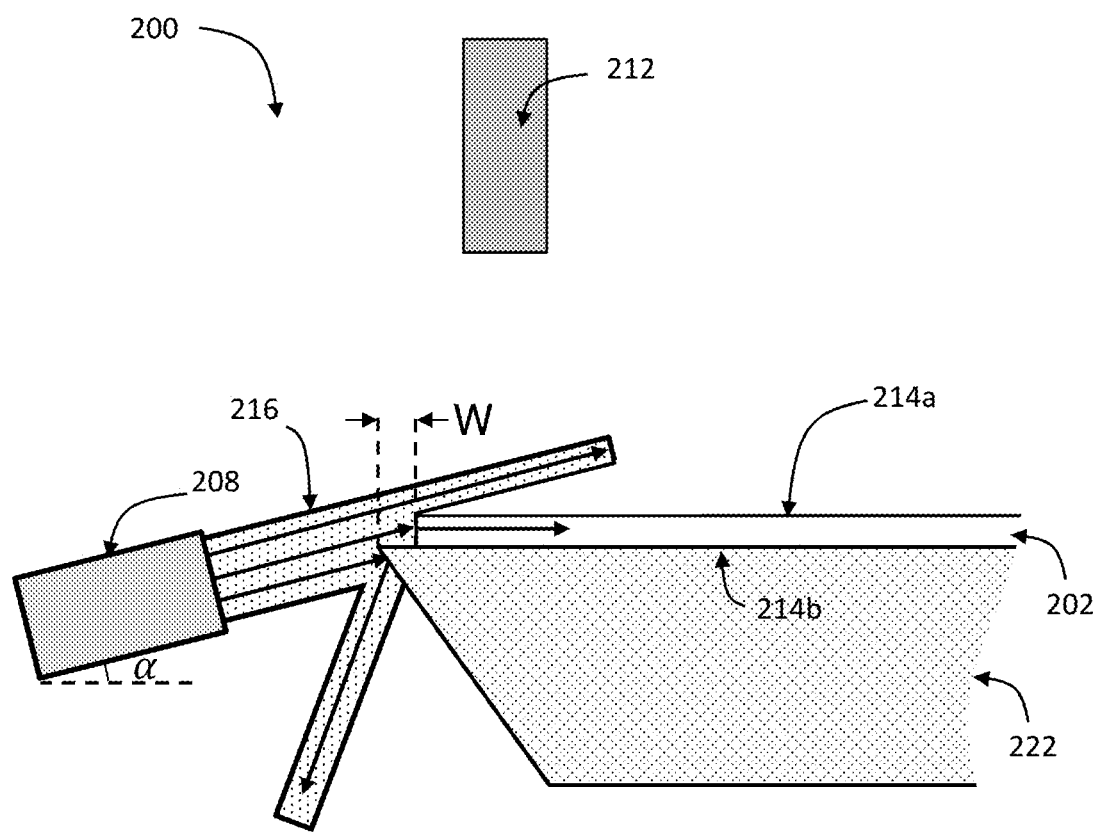
FIG. 2B is a schematic side view of an apparatus for crack detection, according to some illustrative embodiments.

FIG. 2B shows another embodiment where the light source 208 is angled upward so as to avoid being directly incident on the first (i.e., upper) face 214a of the wafer 202, but with the addition of a stage (i.e., chuck) 222 which extends past the side of the wafer so as to cast a shadow over the lower portion of the side of the wafer on which the light is incident. Such an arrangement blocks the light from directly impinges on the second (i.e., lower) face 214b of the wafer, including the edge defined by the lower face and the side of the wafer on which the laser light is incident. In some embodiments, the side of the chuck is fabricated to have an angle as shown so that any light which impinges upon it is reflected downward and away from the camera. In some embodiments, the angled side of the chuck forms a sharp edge with the first face of the chuck in order to eliminate reflections from this edge. As shown in FIG. 2B, the wafer may be offset from the edge of the stage by a distance W so that light does not impinge on a lower edge of the wafer. The offset may be any suitable offset to avoid scatting effects that may confuse an image recorded by a camera 212, including, but not limited to 100 microns, 200 microns, 250 microns, 300 microns, and/or any other suitable distance. In some embodiments, the offset may correspond to a thickness of the wafer. According to the embodiment of FIG. 2B, the angle of the illumination source, α, may be any suitable angle to avoid light impingement on the lower face of the wafer which still providing incident light on the side of the wafer. In some embodiment, the angle, α, may be approximately 15°, 30°, 40°, 45°, and/or any other suitable angle.

Figure 3A:
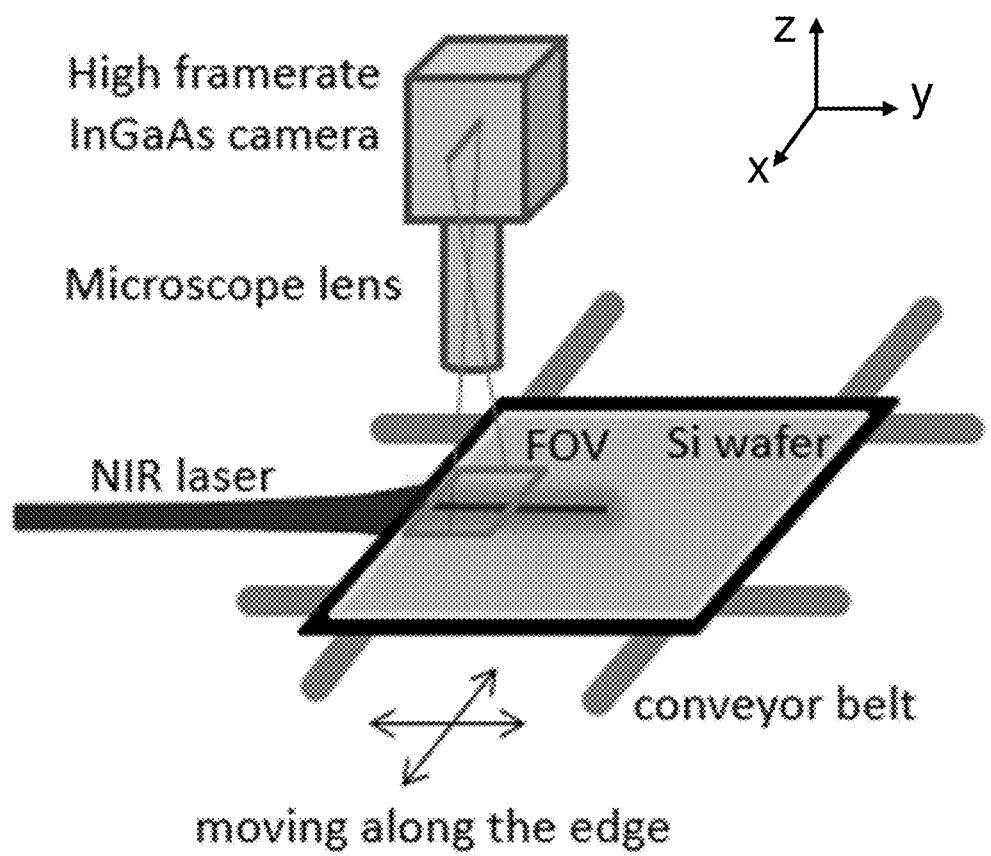
FIG. 3A is a schematic of an apparatus for crack detection, according to an illustrative embodiment.
Figure 3B:
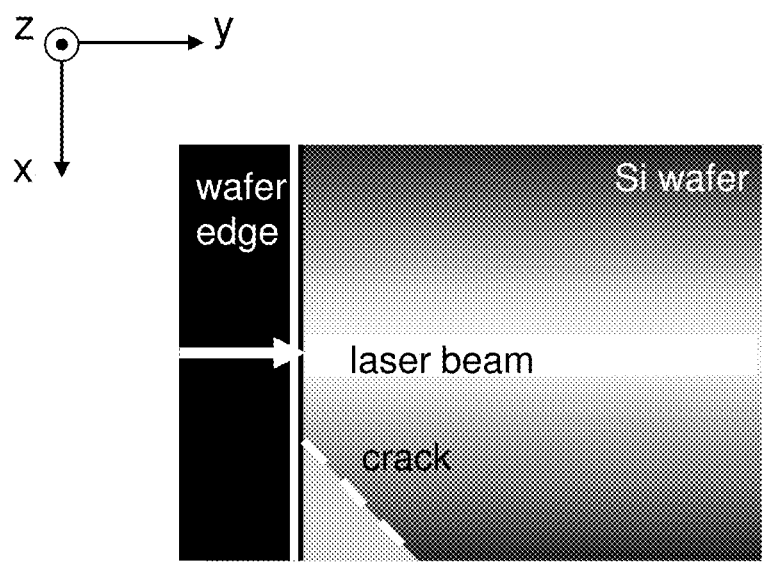
FIG. 3B is a schematic of a near infrared (NIR) image of a crack in a silicon (Si) wafer, according to an illustrative embodiment.
Figure 3C:
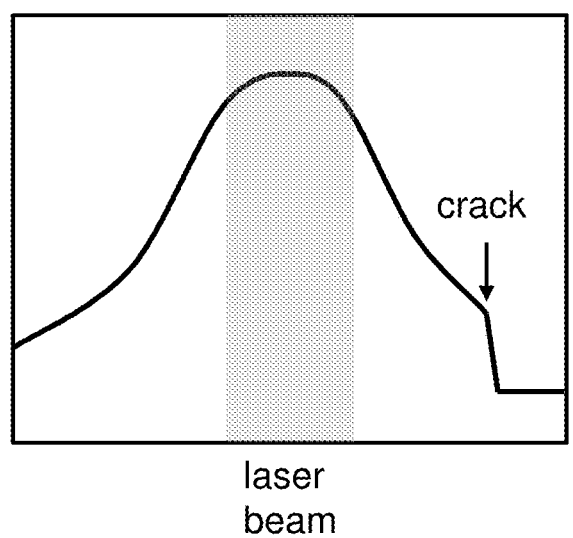
FIG. 3C is an illustration of a crack signal in a linescan profile (parallel to the silicon wafer side in FIG. 3B), according to an illustrative embodiment.

Example of a Prototype Apparatus Using Side-Coupled Vicinal Illumination for Micro-Crack Detection, and Methods Associated with the Apparatus The Inventors designed a prototype apparatus using vicinal illumination in a side-coupling geometry (e.g., coupled in to a side of a silicon wafer) to achieve a high sensitivity to image micro-cracks with all wafer orientations. FIG. 3A-FIG. 3C show schematic illustrations of the Inventors' prototype apparatus. The main features were: (1) an indium gallium arsenide (InGaAs) camera (with high framerate), (2) a microscope objective lens (with a long working distance), (3) a focused NIR laser (with a wavelength of 1310 nm) for side-coupled illumination, and (4) a two-axis movement stage for a Si wafer. In order to determine light-crack interaction and to demonstrate the detectability of sub-mm cracks, the Inventors started with an InGaAs camera with an array of 320×256 pixels. With a 5× objective lens, the pixel array of the InGaAs camera could map an area of 1.9×1.5 mm$^2$. The NIR laser was focused into a small beam spot that was less than 200 microns in diameter, and was coupled into a side of a silicon wafer. An image was captured with the camera facing the top surface of the wafer. The full wafer could be scanned by moving the two-axis stage relative to the camera, by moving the camera relative to the stage, or by moving both the stage and the camera relative to one another.

FIG. 3A-FIG. 3C illustrate schematics of the Inventors' prototype for crack detection. FIG. 3A is an illustration of the crack detection apparatus. FIG. 3B is an illustration of a NIR image (e.g., taken using the apparatus of FIG. 3A) of a crack. FIG. 3C shows an illustration of a crack signal in a linescan profile (parallel to the wafer side in FIG. 3B) where the change in detected light intensity is easily distinguished from the other portions of the signal. Such a linescan can be extracted from a full area image or can be produced by a dedicated linescan camera having a single line of pixels.

Figure 4A:
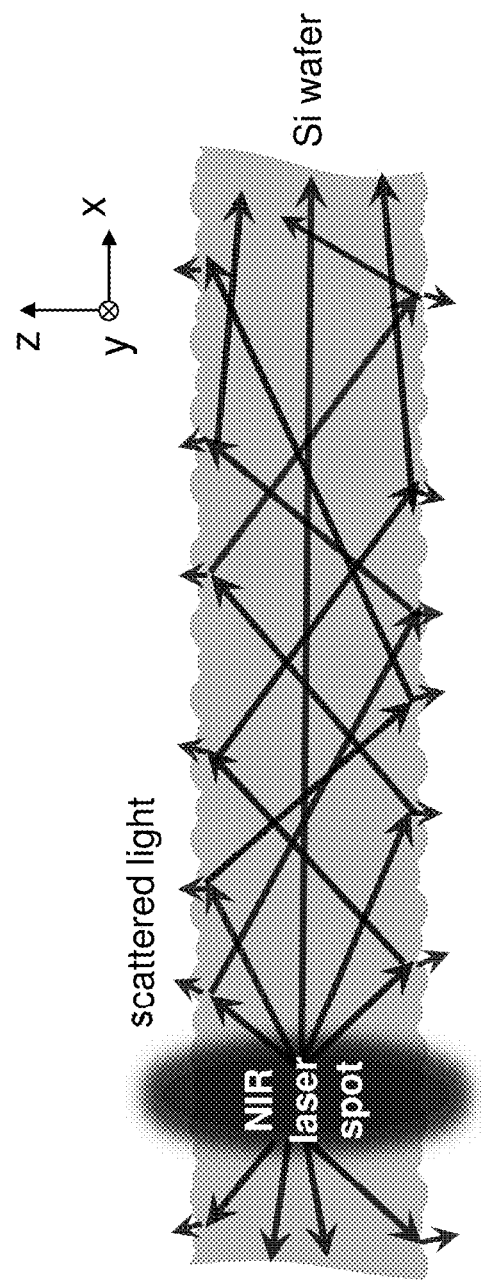
FIG. 4A is a schematic of a cross-sectional view from a side of a rough silicon wafer without a crack, according to an illustrative embodiment.
Figure 4B:
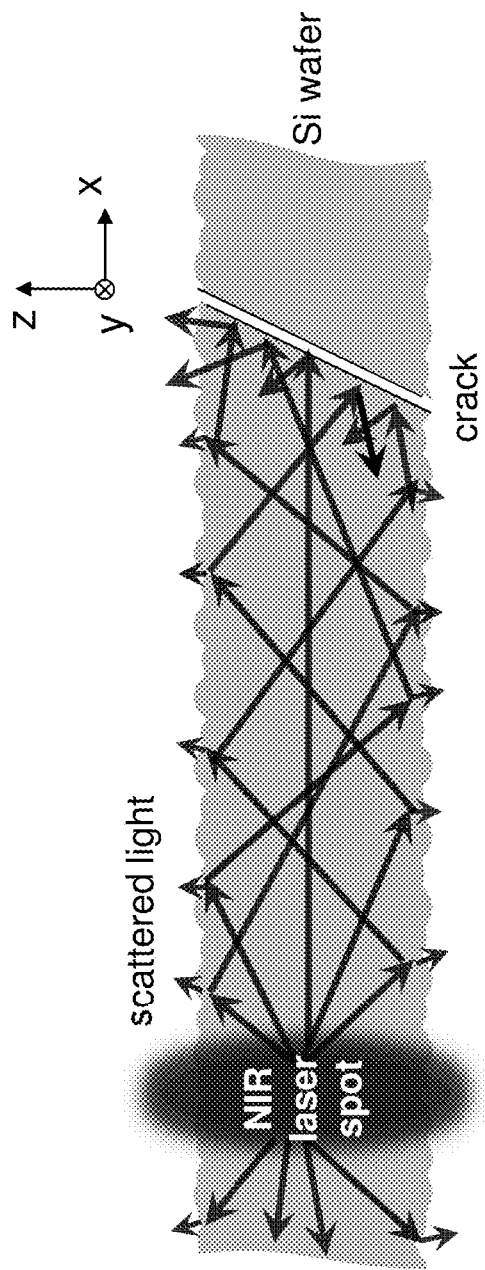
FIG. 4B is a schematic of a cross-sectional view from a side of a rough silicon wafer with a crack, illustrating a crack detection mechanism for vicinal side illumination, according to an illustrative embodiment.

FIG. 4A-FIG. 4B show specifically how vicinal illumination works in the apparatus of FIG. 3A, where the scattered light propagates sideways. In a case where the scattered light propagates sideways and interacts with a micro-crack, In this case, an abrupt signal contrast in the images results which can be also seen in FIG. 3B, or the linescan profile in FIG. 3C. FIG. 4A-FIG. 4B are views substantially along the direction of propagation of the laser. Although they show the laser as an incident spot, the same sideways propagation would apply when the laser is incident as a line.

FIG. 4A-FIG. 4B are schematic illustrations of the crack-detection mechanism for the vicinal side illumination. FIG. 4A is a cross-sectional view from the side of a Si wafer with surface texture and without a crack, and FIG. 4B is a cross-sectional view of a Si wafer with surface texture and with a crack.

Detection Capability of Micro-Cracks

Figure 5A:
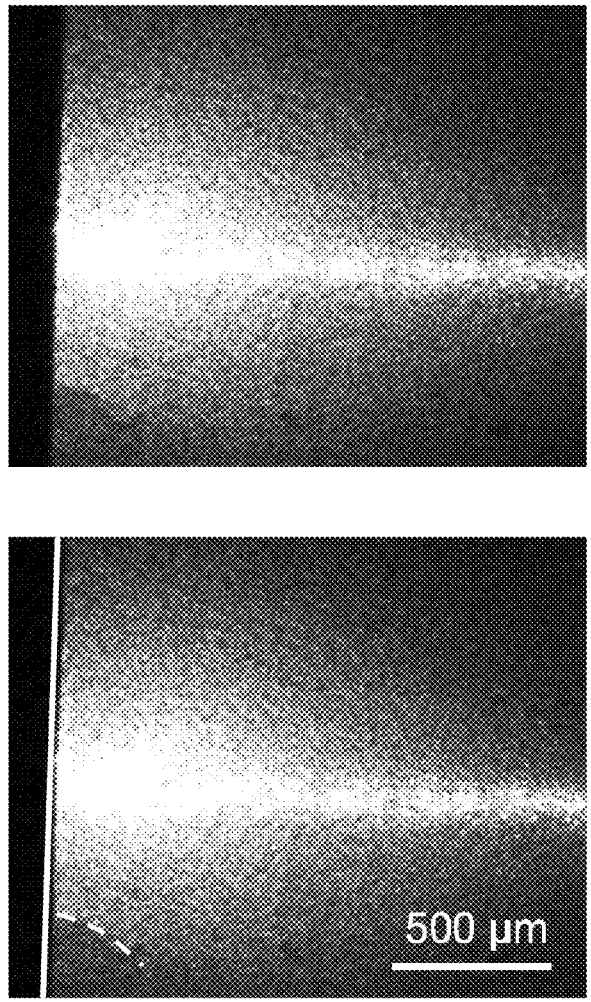
FIG. 5A is a near infrared image of a sub-millimeter (sub-mm) long crack in an as-cut multicrystalline silicon (multi-Si) wafer, according to an illustrative embodiment.
Figure 5B:
FIG. 5B is a near infrared image of a sub-millimeter (sub-mm) long crack in a double-side acid-textured multicrystalline silicon wafer, according to an illustrative embodiment.
Figure 5B:
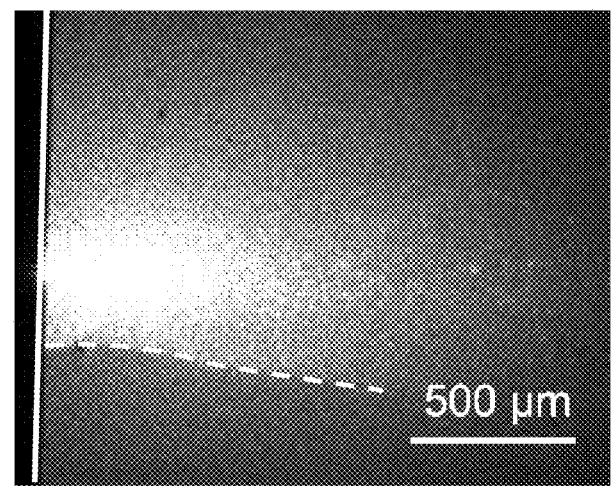
Figure 5C:
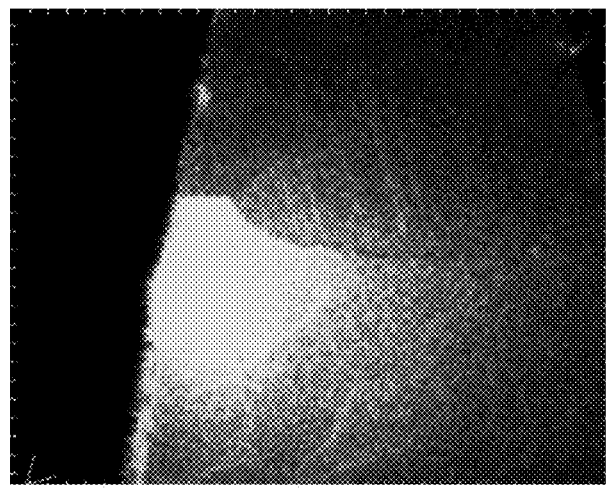
FIG. 5C is a near infrared image of a sub-millimeter (sub-mm) long crack in a laser-cut solar cell comprising a multicrystalline silicon wafer, according to an illustrative embodiment.
Figure 5C:
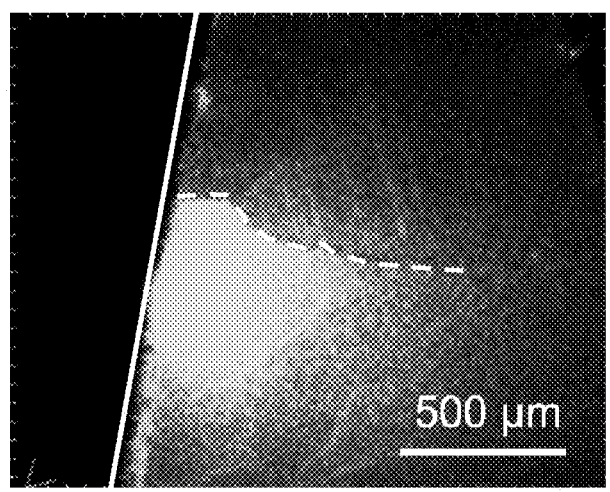

The Inventors demonstrated herein that their apparatus and methods can detect sub-mm cracks for different Si wafers or solar cells. FIG. 5A-FIG. 5C shows images of micro-crack detection in three different sample types, namely as-cut multi-Si wafer (FIG. 5A), acid-textured multi-Si wafer (FIG. 5B), solar cells with laser cut sides (FIG. 5C). The applicability of the crack detection apparatus and methods on various sample may be desirable in order to find out where cracks were initiated (e.g., at critical steps in a solar cell manufacturing process).

FIG. 5A-FIG. 5C are NIR images of sub-mm long cracks in multi-Si wafers (or solar cells) at different processing steps: as-cut wafer (FIG. 5A), double-side acid-textured wafer (FIG. 5B), and laser-cut solar cell (FIG. 5C, where light enters a laser-cut side). Each of FIG. 5A-5C depicts the multi-Si wafers as they appear from the camera, and a marked up image showing the position of the wafer side and crack. The solid lines indicate the position of the wafer side and the dashed lines indicate the position of the crack.

The illustrative crack detection apparatus also demonstrated advantages over possible alternatives. Alternative methods and systems include but are not limited to rear surface illumination, side illumination with unfocused large beam, and direct side illumination with focused small beam.

Figure 6A:
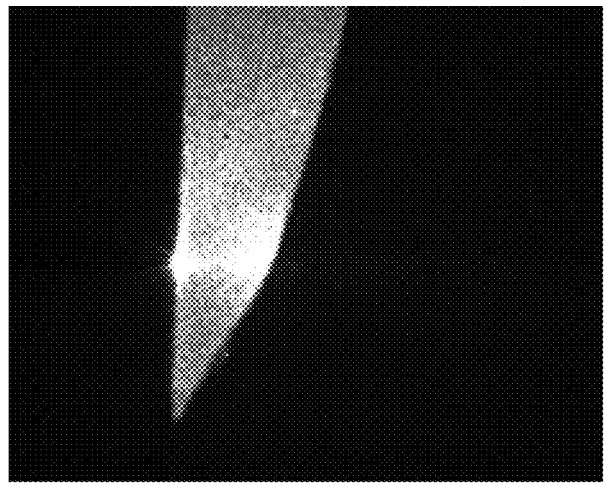
FIG. 6A is a near infrared image of a crack (herein referred to as Crack 1, bent toward a side of a multi-Si wafer) under side illumination with a focused laser, according to an illustrative embodiment.
Figure 6A:
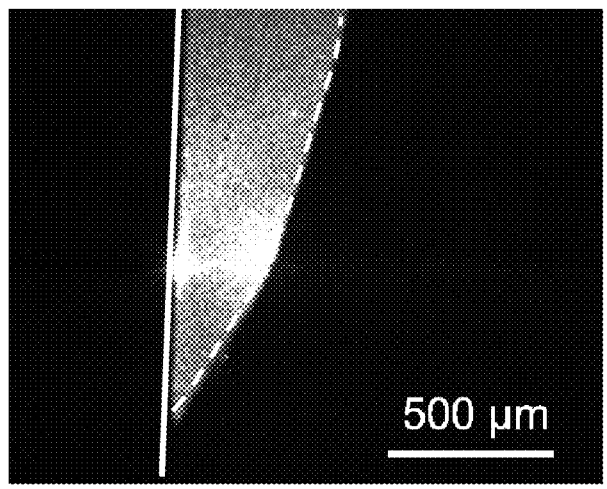
Figure 6B:
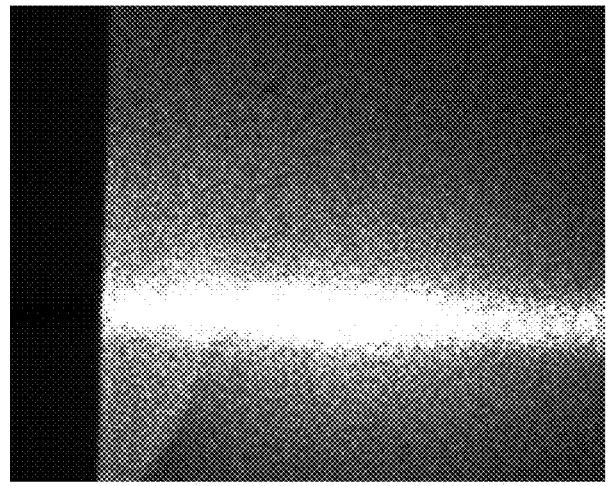
FIG. 6B is a near infrared image of a crack (herein referred to as Crack 1, bent toward a side of a multi-Si wafer) under rear surface illumination (with near ninety degrees oblique angle of incidence to a plane of the rear surface of the multi-Si wafer) with a focused laser, according to an illustrative embodiment.
Figure 6B:
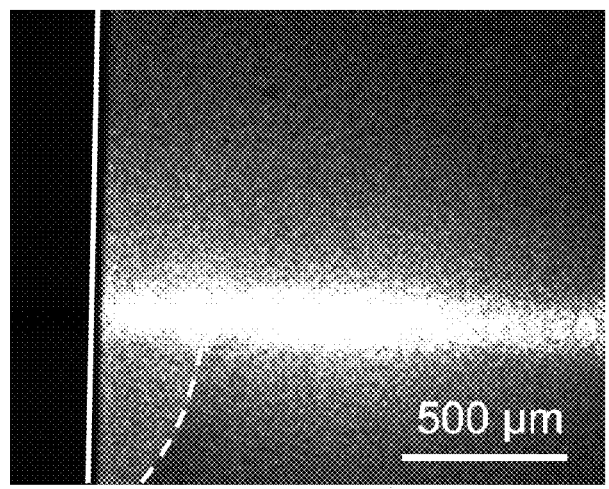
Figure 7A:
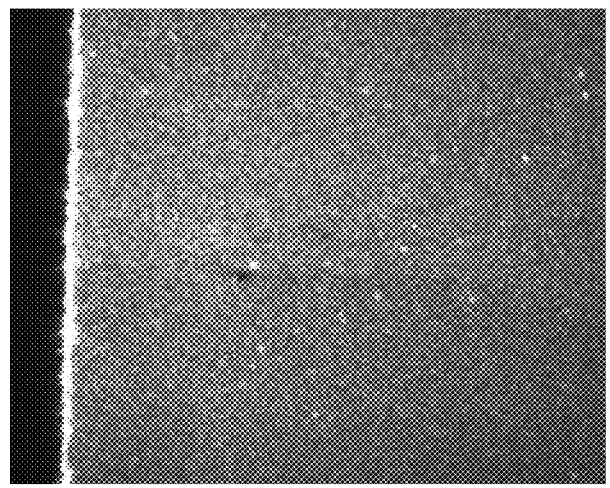
FIG. 7A is a near infrared image of a crack (herein referred to as Crack 2, perpendicular to a side of a multi-Si wafer) under side illumination with an unfocused large laser beam around the crack, according to an illustrative embodiment.
Figure 7A:
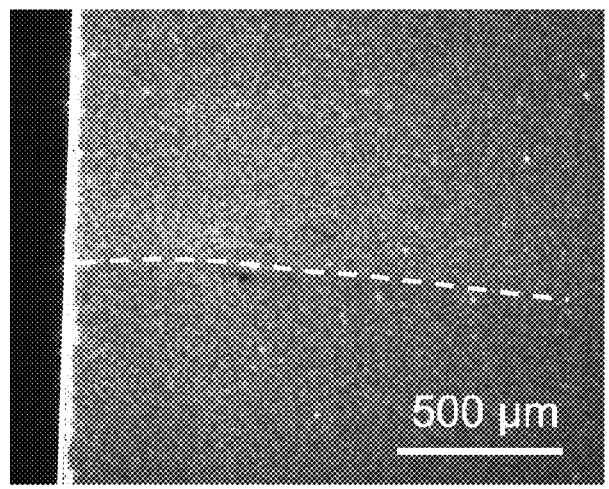
Figure 7B:
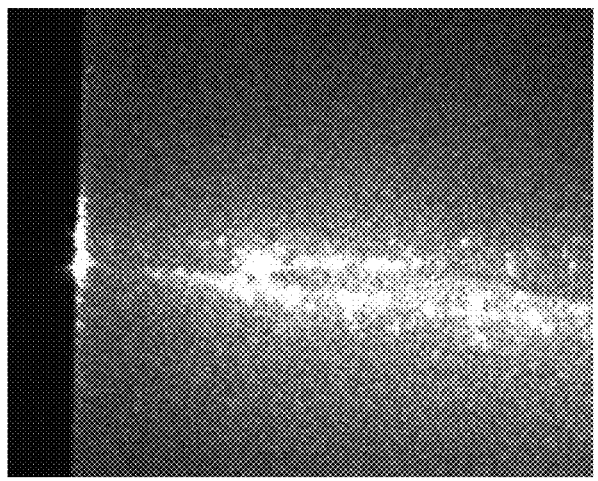
FIG. 7B is a near infrared image of a crack (herein referred to as Crack 2, perpendicular to a side of a multi-Si wafer) under small-spot side illumination directly on the crack, according to an illustrative embodiment.
Figure 7B:
Figure 7C:
FIG. 7C is a near infrared image of a crack (herein referred to as Crack 2, perpendicular to a side of a multi-Si wafer) under small-spot side illumination vicinal to the crack, according to an illustrative embodiment.
Figure 7C:
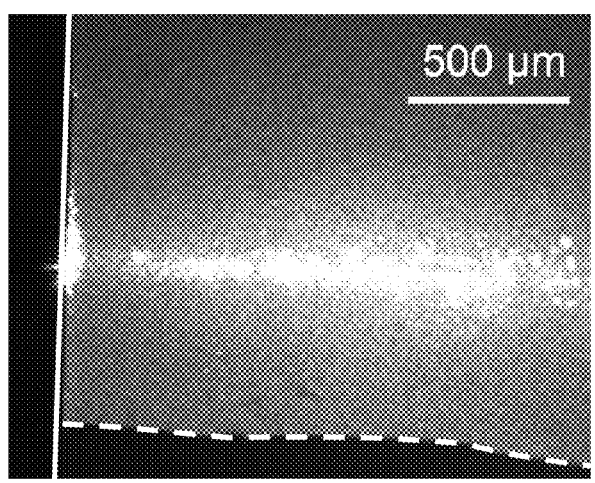

FIG. 6A-FIG. 6B are NIR images of Crack 1 (shown in a dashed line bent toward multi-Si wafer side denoted with a solid line) under two illumination modes with a focused laser: (FIG. 6A) side illumination and (FIG. 6B) rear surface illumination (with near-90 degrees oblique angle of incidence). FIG. 7A-FIG. 7C are NIR images of Crack 2 (shown in a dashed line perpendicular to multi-Si wafer side denoted in a solid line) under different illumination modes: (FIG. 7A) side illumination with an unfocused large light beam around crack, (FIG. 7B) small-spot side illumination directly on crack, and (FIG. 7C) small-spot side illumination vicinal to crack. The resulting images from these different detection techniques are compared below.

Crack 1 (dashed line) and Crack 2 (dashed line) in FIG. 6A-FIG. 6B and FIG. 7A-FIG. 7C respectively were selected as representatives of two types of cracks to show some advantages of the illustrative vicinal side illumination apparatus. FIG. 6A shows that Crack 1 was easily detectable under vicinal side illumination, but Crack 1 was not shown clearly in FIG. 6B under rear surface illumination. The rear surface illumination method was very similar to NIR transmission imaging. Moreover, FIG. 7C showed that Crack 2 was easily detectable under vicinal side illumination with a small-spot laser beam. In contrast, Crack 2 effectively disappeared in the full-area side illumination in FIG. 7A. In FIG. 7B, the crack was ambiguously identifiable when the image was taken under small-spot side illumination directly at the crack position. A crack that was perpendicular to the wafer side (e.g., Crack 2) was usually undetectable for that technique based on direct illumination from the side. The findings in FIG. 6A-FIG. 6B and FIG. 7A-FIG. 7C revealed that orientation when detecting the cracks had no perceivable effect on the sensitivity of the illustrative crack-detection mechanism.

Improved Robustness by Thin-Line Laser Illumination

Figure 8A:
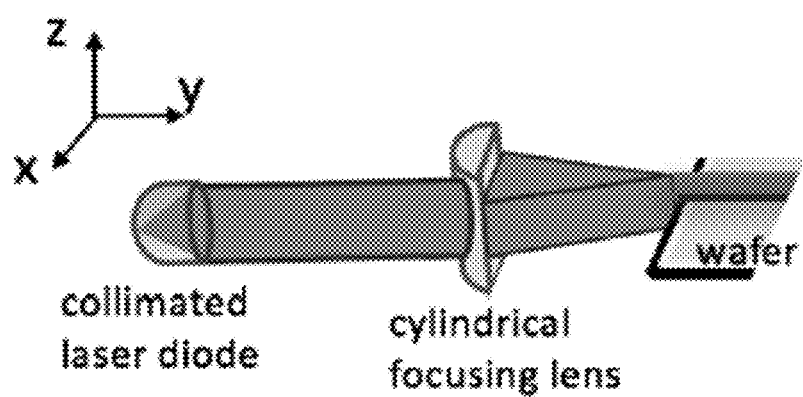
FIG. 8A is a three-dimensional illustration of laser illumination of a wafer by a combination of a spherical collimation lens and a cylindrical focusing lens, including wafer position, according to an illustrative embodiment.
Figure 8B:
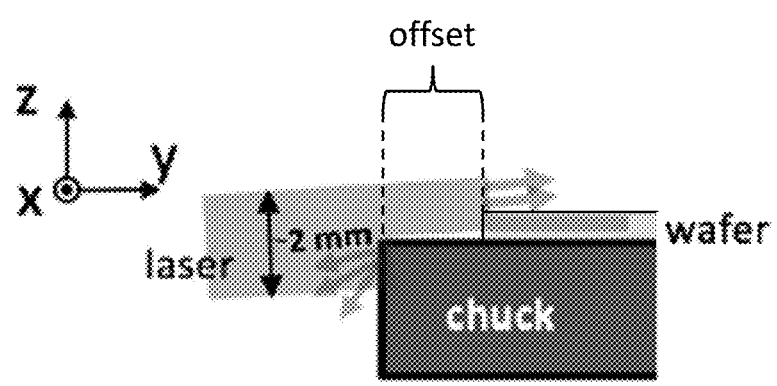
FIG. 8B is a close-up illustration of the y-z plane from the illustration of FIG. 8A showing wafer position, according to an illustrative embodiment.
Figure 8C:
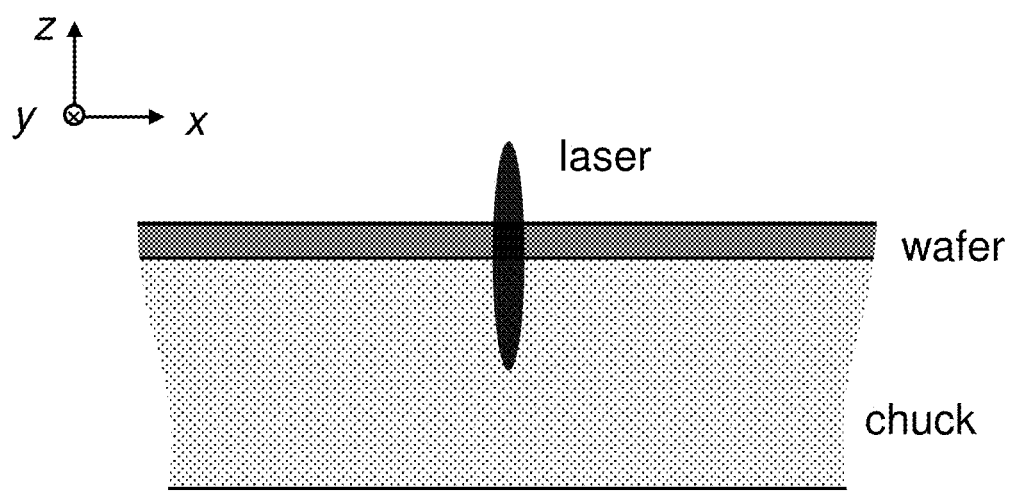
FIG. 8C is a close-up illustration of the x-z plane from the illustration of FIG. 8A showing relative position and size of the wafer and the laser beam, according to an illustrative embodiment.

It was a challenge to ensure the laser beam was coupled into the wafer through the side while the Si wafer was moving at a relative high speed and may therefore have vibrated in the z direction during movement. In order to improve the robustness of light coupling, instead of focusing into a 200-microns-diameter circular spot by a spherical lens, the laser beam was first collimated with a spherical convex lens and then focused into a 200-microns-width thin line with a cylindrical convex lens as illustrated in FIG. 8A-FIG. 8C. The height of the laser line was kept at around 2 mm, which was larger than the z-axis position tolerance of the Si wafer, thereby guaranteeing that the laser line spans the wafer thickness without the need to track. The laser was intentionally tilted upward by 1-2 degrees to prevent photons from being incident on the first face of the wafer (the first face was the surface facing the camera). Meanwhile, to prevent photons from impinging on the rear surface of the wafer (the rear face was the surface facing away from the camera and parallel-planar with the first face of the wafer), the wafer was placed onto a chuck (see, e.g., FIG. 8B-FIG. 8C) with an offset around 1 mm, and the chuck was coated with an NIR absorbing material to absorb the incoming light beneath the wafer.

FIG. 8A-FIG. 8C shows an illustrative design of laser illumination by a combination of a spherical collimation lens and a cylindrical focusing lens. FIG. 8A is a 3D illustration of the illumination and wafer position. FIG. 8B is a close-up illustration of the y-z plane from FIG. 8A for wafer position. FIG. 8C is a close-up illustration of the x-z plane from FIG. 8A for the relative position between the Si wafer and the laser beam.

Robust and High-Throughput Design by Anamorphic Imaging

Figure 9:
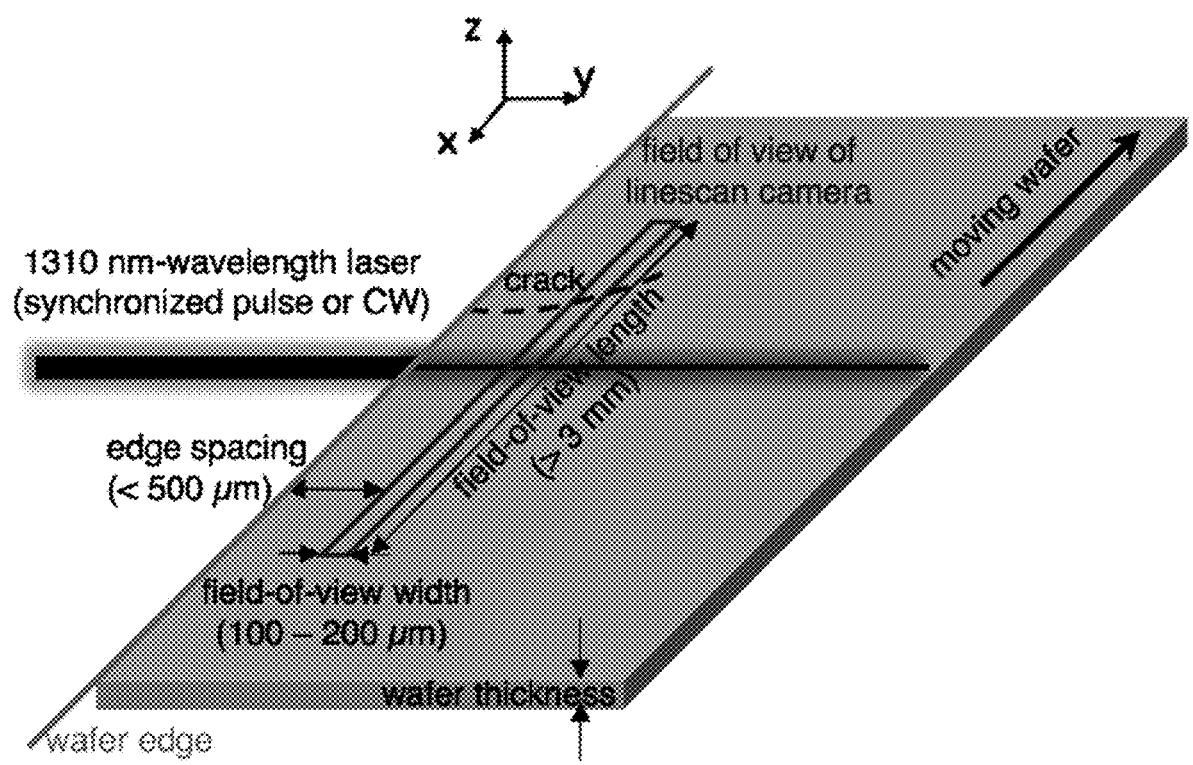
FIG. 9 is a close-up illustration of a crack detection apparatus including a linescan camera for imaging, according to an illustrative embodiment.

The linescan camera (e.g., as shown in the apparatus of FIG. 3A) had an InGaAs detector array of 1×1024 pixels or 1×2048 pixels. A long side of the linescan camera was aligned along the direction of a wafer side (e.g., along the x-axis in FIG. 9), and perpendicular to the propagation direction of the laser beam. FIG. 9 is a close-up illustration of an illustrative crack detection apparatus with linescan camera imaging. A spacing near the side of 500 microns or less was left, e.g., to tolerate misalignment in the y-axis direction in during movement of the wafer or the camera or both. In embodiments with features of FIG. 9, crack detection results from signal contrast along the x-axis. To promote high signal contrast, anamorphic imaging was adopted with the projected dimension in the long side of linescan camera at around 5 microns, and with the projected dimension of the 1-pixel side at between or equal to around 100 microns and 200 microns. The anamorphic ratio was therefore around 20 times, which could be achieved, e.g., by asymmetric dimensions of the pixels in the detector array and/or by an additional cylindrical lens between the objective lens and detector array. An advantage of the asymmetrical pixel array was to reduce noise due to non-uniform scattering at the Si wafer surface by averaging over some width of the wafer surface in the y direction of FIG. 9, and therefore improve the robustness of the detection.

Wafer Movement Considerations for High-Throughput Tool Operation

In some embodiments, the relative position of the laser impingement on the side of the wafer and the position of the camera are fixed and there is relative motion between the wafer and the laser and camera combination. This relative motion can be step-wise where an image is taken after each motion. In such a case, the laser can be on continuously (i.e., always on). In other embodiments where it is desired to scan the length of the wafer at high speed, it may be advantageous to create continuous motion between the wafer and the laser and camera combination. In such embodiments, the laser illumination may be provided in a pulsed mode, thereby creating a strobe effect and capturing a sharp image even while the motion is underway. It will be understood that in either case, the location of any cracks is not known prior to the scan. Thus, it may be that none of the images happen to have direct illumination of the crack and all images are vicinal in nature. However, it may be that some fraction of the images do have direct illumination. As the location of the laser light within the line scan is known, these images can be removed from consideration. As there will generally be between zero and several cracks on a side, the elimination of such frames from further analysis, leaves the vast majority of frames available for analysis. The timing of image acquisition and, in the case of continuous motion, of the pulsed laser illumination may be provided linear encoders, motor controllers, etc.

In-line crack detection with a high throughput of 1 second per wafer was developed by the Inventors. With four linescan cameras, the four sides of 156-mm-wide (square or pseudo-square) Si wafers could be scanned within 1 second. To achieve 1 second per side per camera, the movement of Si wafer was continuous (e.g., instead of stepping mode). The acceleration of the wafer chuck was around 3500 mm/s$^2$ to reach the constant scanning speed at 173 mm/s in 50 ms. The same duration was used to decelerate the wafer chuck. Therefore, the total travel distance was around 165 mm. The specifications were designed based on an off-the-shelf motorized translational stage. While the wafer was moving at a given speed, the linescan camera captured an image at a high framerate while maintaining a good signal level. The typical dynamic range of an InGaAs array is from 500:1 to 2000:1. Assuming crack detection at the end of a long axis of a field of view with a dynamic range of 100:1, it was determined that images were to be captured around 1.5 mm apart.

TABLE I

Specifications for Si wafer movement in an illustrative crack detection apparatus

| Design Parameters | Value Settings |
| --- | --- |
| Total time per side | 1 s (required input) |
| Acceleration time | 0.05 s (required input) |
| Wafer side distance (active scanning) | 156 mm (required input) |
| Acceleration/Deceleration | 3467 mm/s$^2$ |
| Constant scanning speed | 173 mm/s |
| Acceleration/Deceleration distance | 4.3 mm |
| Total distance | 164.6 mm |
| Camera frame rate | 1.5 mm/frame (or 115 frame/s) |
| Total number of frames per | >105 frames |

Figure 10A:
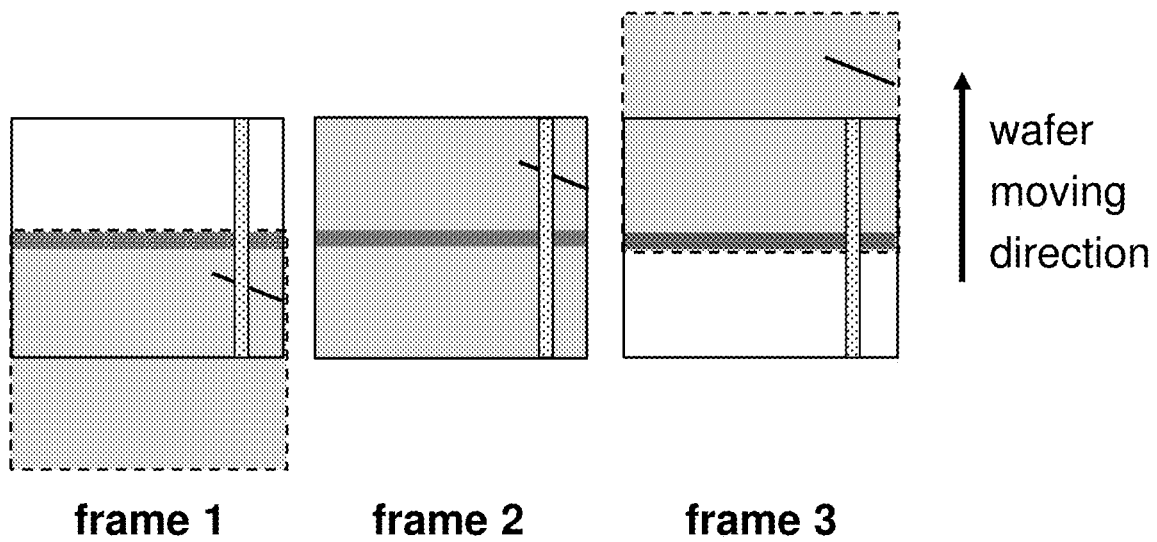
FIG. 10A is a schematic illustration of a case (referred to herein as Case 1) where a crack is vicinal to a laser beam, according to an illustrative embodiment.
Figure 10B:
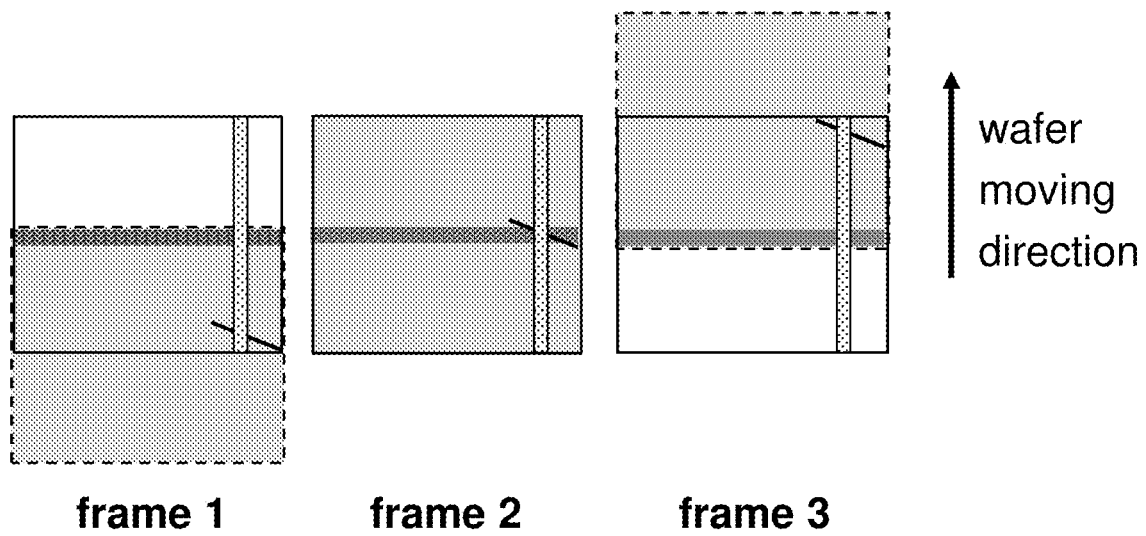
FIG. 10B is a schematic illustration of a case (referred to herein as Case 2) where a crack may directly interact with the laser beam, according to an illustrative embodiment.
Figure 10C:
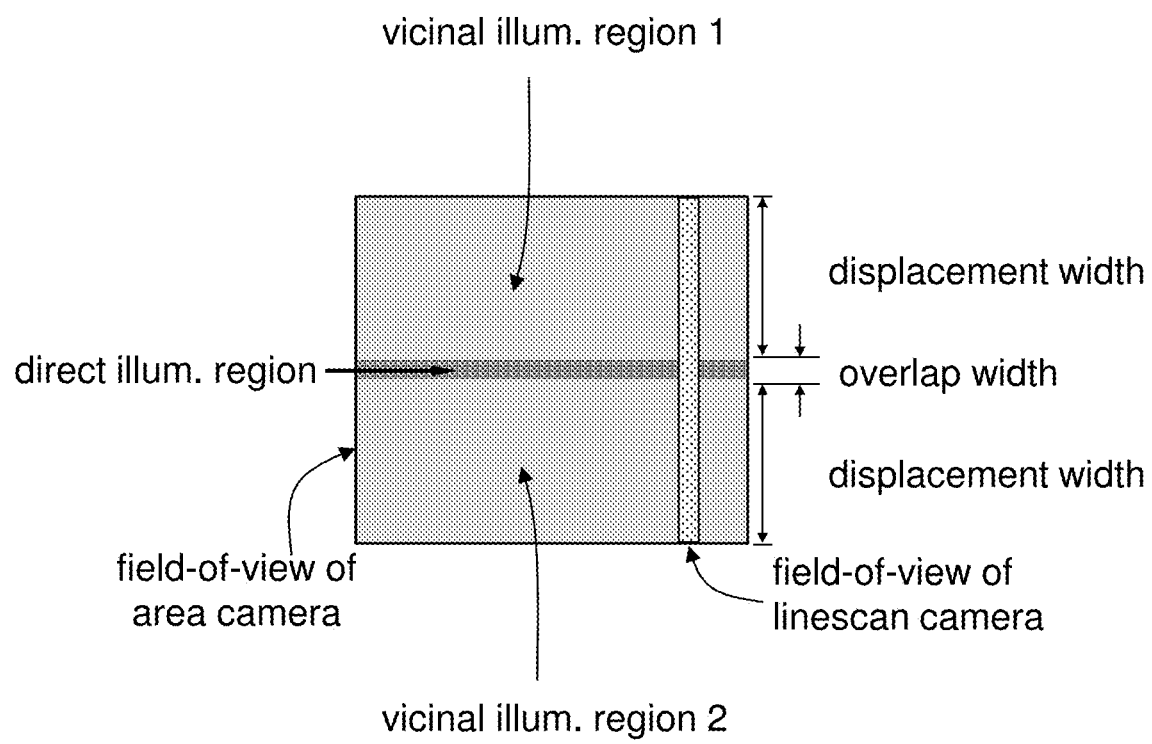
FIG. 10C is a schematic illustration with labels indicating what the visuals in FIG. 10A and FIG. 10B represent, according to an illustrative embodiment.

Operation of an illustrative apparatus is illustrated in FIG. 10A-FIG. 10C by three frames that are captured near the crack. These two cases apply to either the case where the relative motion between the laser/camera combination and the wafer is step-wise or continuous. The diagrams illustrate two possible situations. In Case 1 (FIG. 10A), the crack could be detected in the vicinity of the laser beam in both frame 1 and 2 where the crack is vicinal to the laser, however in frame 3 the crack is out of view. In Case 1, none of the three frames shown happen to be direct illumination. In Case 2 (FIG. 10B), the crack can be detected in frame 1 and 3. FIG. In FIG. 10B (Case 2), the crack may directly interact with the laser beam, e.g., as in frame 2. FIG. 10C is an illustration of the drawings of FIG. 10A-FIG. 10B.

Design of High-Throughput In-Line Metrology

Moreover, to achieve a high throughput in-line detection, an automatic computer algorithm was developed and utilized in addition to the high-framerate linescan camera. The Inventors demonstrated the possibility of micro-crack detection with a linescan profile as shown in FIG. 11A-FIG. 11D, which was extracted from a NIR area image for demonstration purposes. In use, the inventors attained results with a linescan camera, and used design parameters to achieve a full-wafer side scan.

Figure 11A:
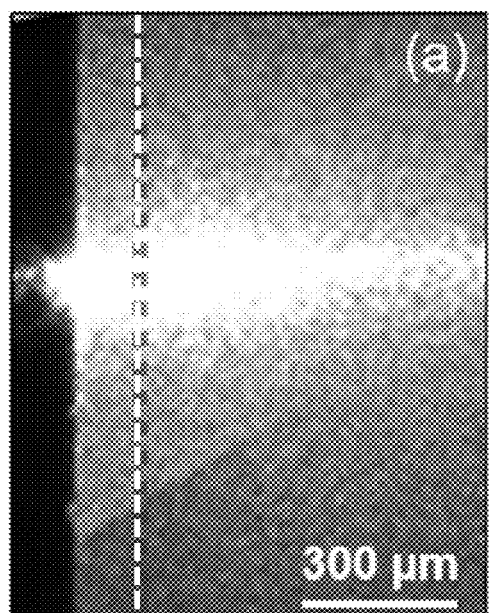
FIG. 11A is a near infrared image of a wafer crack taken by an indium gallium arsenide (InGaAs) area camera, where a linescan profile was taken along the dotted line for automatic crack detection, according to an illustrative embodiment.
Figure 11B:
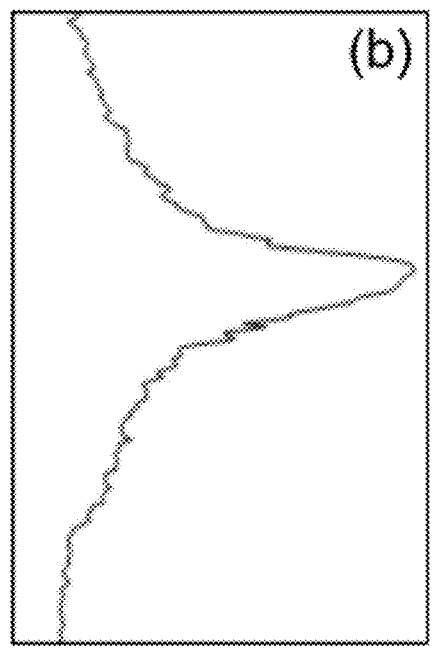
FIG. 11B is a linescan profile along a side direction of a wafer, according to an illustrative embodiment.
Figure 11C:
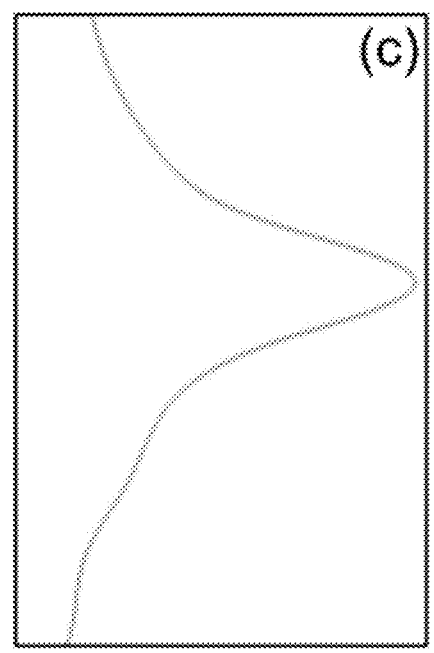
FIG. 11C is a smoothed linescan profile resulting from reducing the noise of the linescan profile of FIG. 11B with a Gaussian filter, according to an illustrative embodiment.
Figure 11D:
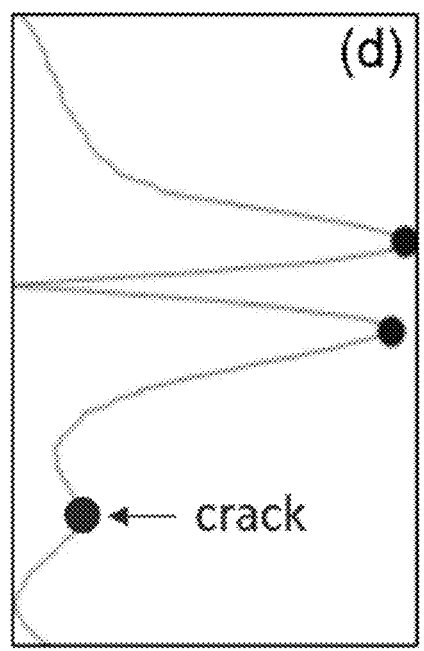
FIG. 11D is a curve resulting from differentiating the smoothed linescan profile of FIG. 11C, according to an illustrative embodiment.

A discontinuity of light propagation was found at the position of a crack (e.g., as can be observed by eye in the InGaAs camera area image in FIG. 11A). Thus, in a computer algorithm, the Inventors started by taking a linescan profile along the side direction (e.g., see FIG. 11B). Subsequently, the noise of the linescan profile was reduced by a Gaussian filter (e.g., see FIG. 11C). Finally, the smoothed linescan profile was differentiated, and the discontinuities of light propagation were shown as local maxima in the differentiated curve (e.g., see FIG. 11D). In FIG. 11D, sharp discontinuities at the position of the laser beam were found as expected (shown as filled circles towards the right of FIG. 11D), in addition to the crack position (shown as a filled circle, labeled "crack," towards the left of FIG. 11D).

FIGS. 11A-11D demonstrate computer-aided crack detection based on a linescan profile parallel to a silicon wafer side. FIG. 11A is a NIR image of a wafer crack taken by an InGaAs area camera, and a linescan profile was taken along the dotted line for automatic crack detection. FIGS. 11A-11D show an illustrative procedure of computer automatic crack detection. The filled circles towards the right of FIG. 11D are the edges of the light beam.

Figure 12A:
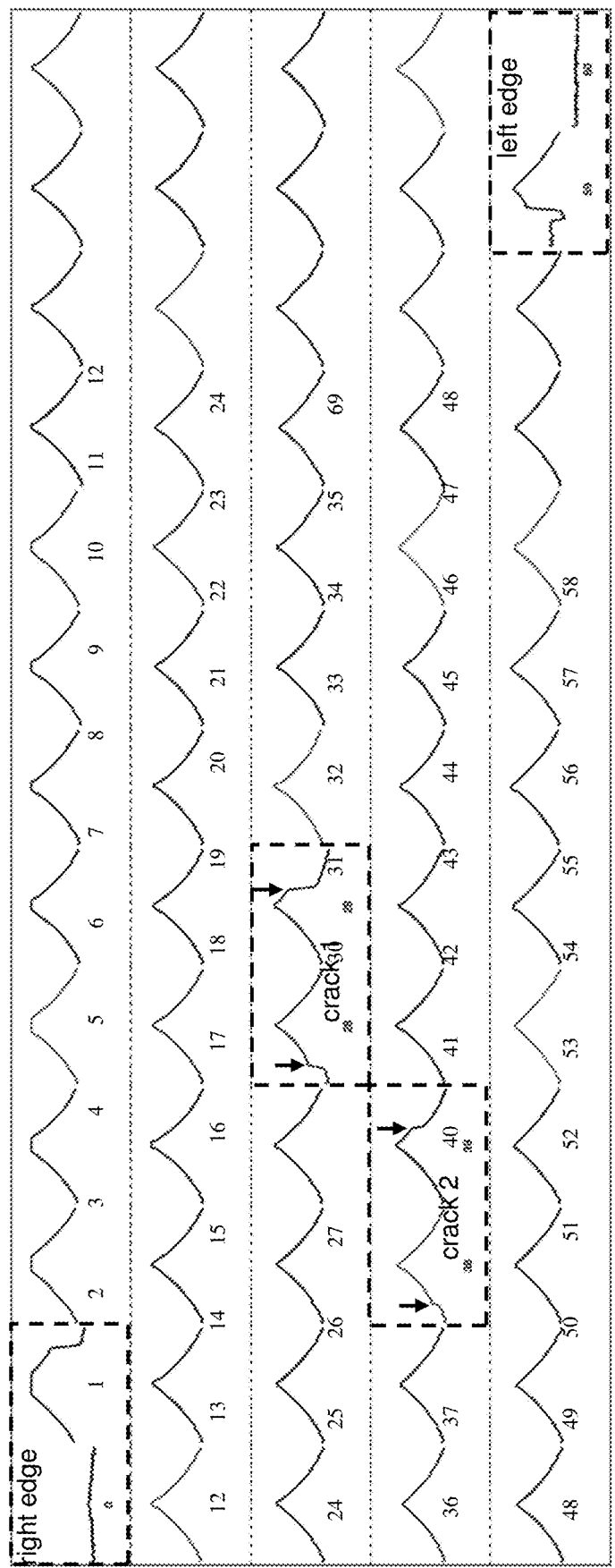
FIG. 12A presents experimental linescan results in a diagram for a multi-crystalline Si wafer, according to an illustrative embodiment.
Figure 12B:
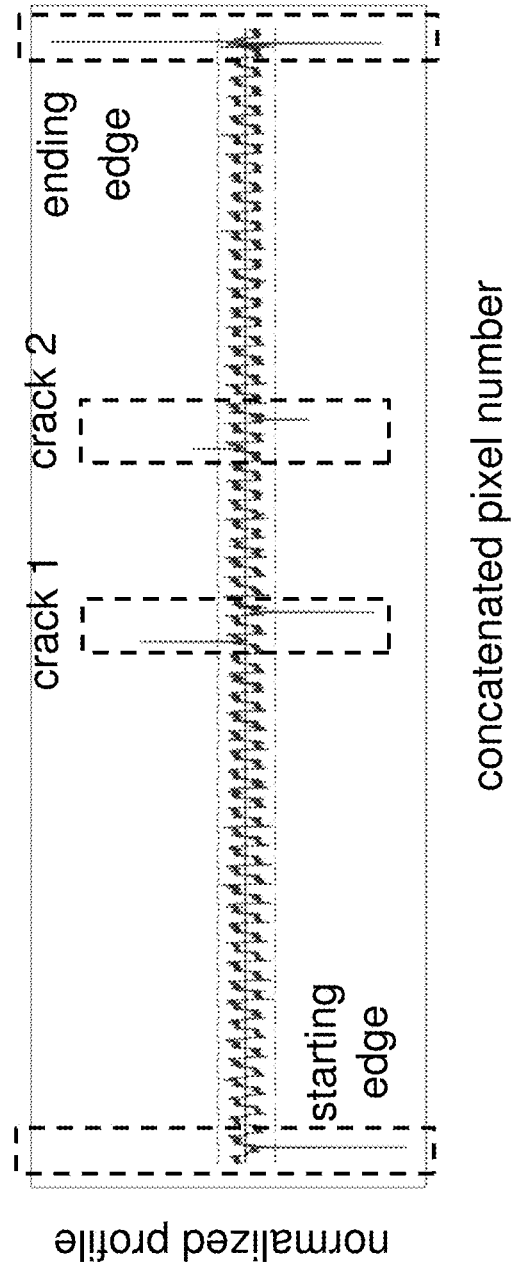
FIG. 12B is a schematic illustration of an anomaly detection algorithm applied to the experimental linescan results of FIG. 12A.

FIGS. 12A-12B shows results of an example in which an as-sawn multi-crystalline Si wafer of 156 mm×156 mm and thickness approximately 180 microns was inspected. The wafer was mounted on a carriage (e.g., chuck) with the carriage overhanging the wafer side by approximately 0.5 mm, and with the carriage having little or no surface perpendicular to the laser light where the light is incident, according to the exemplary apparatus shown in FIG. 2B. The carriage traversed a straight line path in continuous motion at approximately 0.5 m/s. A 1310 nm IR laser diode (Thor Labs, model FPL1053T) was fired by position data from the carriage at intervals corresponding to 2.6 mm of carriage motion. The laser diode had a collimating lens and a cylindrical lens according to the embodiment of FIG. 8A. An InGaAs linescan camera (Sensors Unlimited, model GL2048L-10A-ENC-STD-210) was oriented with its long axis perpendicular to the direction of propagation of the laser light and images a region 10 mm long and 0.1 mm wide which was located 0.5 mm in from the side of the wafer. A total of 61 linescans were collected along the traverse. For each capture of a line scan, the camera's "electronic shutter" was opened for approximately 3.0 milliseconds using "frame-grabber" hardware and software. Approximately 1.0 milliseconds later, the IR laser diode was fired for a duration of approximately 0.2 milliseconds with a current near its maximum rating of 0.5 Amperes. The intense nature of the strobe illumination combined with a short duration in which the camera was gathering light created immunity to ambient light, however, in some embodiments, the ambient light may be kept devoid of infrared as a further precaution. With the carriage traverse rate and duration of laser pulse given above, the image was blurred by approximately 100 microns, a satisfactorily small amount. FIG. 12A shows the 61 linescans each separated by a small gap. The scans shown were derived from raw data from the linescan camera with some noise removed using a Gaussian filter. The peak in the center of each linescan corresponds to the location of the impingement of the laser.

According to the results shown in FIGS. 12A-12B, there are two cracks detected along this side of the wafer. The cracks were measured as a disruption of the smooth line signals. Every crack appeared twice in the two neighboring linescans, where laser position is either ahead or behind the crack. An anomaly detection algorithm was then applied to the data of FIG. 12A, where each pixel value was normalized by dividing by a moving average of the nearest 10 pixels. All the normalized linescans were concatenated as shown in FIG. 12B. After the algorithm is applied, the cracks were then clearly identifiable as anomalous spikes. Based on the average signal value of the linescans without cracks, a detection threshold can be set. That is, an anomalous spike that is higher than the threshold would be detected as a crack. Spikes at the beginning and end of the scan—corresponding to a field of view running off the wafer—may also be ignored. It will be appreciated that any suitable algorithms may be used to detect the discontinuity in the linescans corresponding to cracks, as the present disclosure is not so limited. For example, the algorithm described with reference to FIGS. 11A-11D may be a suitable alternative.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. An apparatus for crack detection comprising:
   a light source constructed and arranged to illuminate a side of a wafer when the wafer is positioned in the apparatus, wherein the light source illuminates a portion of the side of the wafer less than a total length of the side;
a camera directed towards a first face of the wafer when the wafer is positioned in the apparatus; and
wherein a long axis of a field of view of the camera is angled relative to a propagation direction of the light source, and wherein a portion of a field of view of the camera is located outside a direct path of propagation of light from the light source.

2. The apparatus of claim 1, wherein the camera is a linescan camera.

3. The apparatus of claim 1, further comprising the wafer positioned in the apparatus.

4. The apparatus of claim 3, wherein the wafer is at least partially transparent to light emitted by the light source.

5. The apparatus of claim 3, wherein the wafer is a silicon wafer.

6. The apparatus of claim 1, wherein the long axis of the camera is angled perpendicular to the propagation direction of the light source.

7. The apparatus of claim 1, wherein the field of view of the camera is offset from the side of the wafer.

8. The apparatus of claim 7, wherein the field of view of the camera is offset from the side of the wafer by between or equal to 100 microns and 2 mm.

9. The apparatus of claim 1, wherein the light source is a laser.

10. The apparatus of claim 1, wherein light source emits a collimated light beam.

11. An apparatus for crack detection comprising:
a chuck configured to hold a wafer disposed on the chuck;
a camera directed towards a first face of the wafer when the wafer is positioned in the chuck; and
a light source configured to emit a light beam towards a side of the wafer when the wafer is positioned in the chuck, wherein at least one portion of the light beam is oriented at a positive non-zero angle relative to the first face of the wafer when the wafer is positioned in the chuck, and wherein a dimension of the light beam that is normal to the first face of the wafer is larger than a thickness of the wafer, wherein the side of the wafer is offset from an edge of the chuck in a direction away from the light source so that at least a portion of the side of the wafer is blocked from receiving incident light from the light source.

12. The apparatus of claim 11, wherein the wafer is at least partially transparent to light emitted by the light source.

13. The apparatus of claim 11, wherein the wafer is a silicon wafer.

14. The apparatus of claim 11, wherein the light beam includes a wavelength of 1.1 microns.

15. The apparatus of claim 11, wherein the camera is a linescan camera.

16. The apparatus of claim 11, wherein the at least one portion of the light beam is oriented at a positive non-zero angle relative to the first face of the wafer of between or equal to 0.1 degrees and 45 degrees.

17. The apparatus of claim 11, wherein the chuck comprises and/or is coated with a material that absorbs light in a wavelength range of the light beam.

18. The apparatus of claim 11, wherein the light source is a laser.

19. The apparatus of claim 11, wherein the light beam is a collimated light beam.

20. An apparatus for crack detection comprising:
a light source constructed and arranged to illuminate a side of a wafer when the wafer is positioned in the apparatus; and
a camera directed towards a first face of the wafer when the wafer is positioned in the apparatus; and
wherein at least a portion of a field of view of the camera is offset from a path of propagation of light emitted from the light source.

21. The apparatus of claim 20, wherein the path of propagation of light emitted by the light source extends through the field of view of the camera.

22. The apparatus of claim 20, further comprising the wafer positioned in the apparatus.

23. The apparatus of claim 22, wherein the wafer is at least partially transparent to light emitted by the light source.

24. The apparatus of claim 22, wherein the wafer is a silicon wafer.

25. The apparatus of claim 20, further comprising a controller operatively coupled to the camera, wherein the controller analyzes the at least one portion of the field of view offset from the path of propagation of light emitted from the light source to detect the presence of a crack in the substrate.

26. The apparatus of claim 20, wherein the field of view of the camera is offset from the side of the wafer.

27. The apparatus of claim 26, wherein the field of view of the camera is offset from the side of the wafer by between or equal to 100 microns and 2 mm.

28. The apparatus of claim 20, wherein the light source is a laser.

29. The apparatus of claim 20, wherein light source emits a collimated light beam.

30. The apparatus of claim 20, wherein the at least one portion of the field of view of the camera is offset from the path of propagation of light emitted from the light source by at least 0.25 mm.

31. The apparatus of claim 20, wherein the camera is a linescan camera, and wherein the at least one portion of the field of view receives light from vicinal illumination.

* * * * *